US011864436B2

(12) United States Patent
Ochi et al.

(10) Patent No.: US 11,864,436 B2
(45) Date of Patent: Jan. 2, 2024

(54) DISPLAY DEVICE WITH FRAME CORNER AND BARRIER WALL

(71) Applicant: SHARP KABUSHIKI KAISHA, Sakai (JP)

(72) Inventors: Hisao Ochi, Sakai (JP); Jumpei Takahashi, Sakai (JP); Tohru Sonoda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 469 days.

(21) Appl. No.: 17/286,188

(22) PCT Filed: Oct. 18, 2018

(86) PCT No.: PCT/JP2018/038837
§ 371 (c)(1),
(2) Date: Apr. 16, 2021

(87) PCT Pub. No.: WO2020/079805
PCT Pub. Date: Apr. 23, 2020

(65) Prior Publication Data
US 2021/0296425 A1 Sep. 23, 2021

(51) Int. Cl.
*H10K 59/131* (2023.01)
*G09G 3/3225* (2016.01)
*H10K 50/84* (2023.01)

(52) U.S. Cl.
CPC ......... *H10K 59/131* (2023.02); *G09G 3/3225* (2013.01); *H10K 50/841* (2023.02)

(58) Field of Classification Search
USPC .......................................................... 257/40
See application file for complete search history.

(56) References Cited

U.S. PATENT DOCUMENTS

| 2017/0221434 | A1 | 8/2017 | Shima | |
| 2017/0249905 | A1* | 8/2017 | Kim | G09G 3/3233 |
| 2019/0228724 | A1 | 7/2019 | Shima | |
| 2020/0066220 | A1 | 2/2020 | Shima | |
| 2022/0165823 | A1* | 5/2022 | Ichikawa | H05B 33/12 |

FOREIGN PATENT DOCUMENTS

JP     2017-134339 A     8/2017

* cited by examiner

*Primary Examiner* — Nduka E Ojeh
(74) *Attorney, Agent, or Firm* — ScienBiziP, P.C.

(57) ABSTRACT

A display panel includes a frame region surrounding a display region. The frame region includes: a frame corner including a round corner having a curved outline in plan view of the display panel; and two sides provided so that the frame corner is sandwiched between the two sides. The two sides include: a first frame side in parallel with gate wires; and a second frame side in parallel with source wires. A gate driver and an emission driver are divided and provided to the first frame side and the second frame side.

18 Claims, 12 Drawing Sheets

DISPLAY DEVICE WITH FRAME CORNER AND BARRIER WALL

TECHNICAL FIELD

The disclosure relates to a display device.

BACKGROUND ART

In recent years, light-emitting organic electroluminescence (EL) display devices using organic EL elements are drawing attention as a replacement for liquid crystal display devices.

An organic EL display device includes a sealing layer to cover an organic EL element in order to reduce deterioration of the organic EL element caused when such impurities as water and oxygen enter the organic EL display device. In a proposed sealing structure using such a sealing layer, the sealing layer is a multilayer film made of an organic film and an inorganic film. The organic film included in the sealing layer is formed, for example, by inkjet printing. An organic EL display device including a sealing layer such as the organic film is provided with a barrier wall to keep an organic material (ink), for forming the organic film, from spreading outside a frame region during a process for manufacturing the organic EL display device.

Moreover, in order to improve convenience and appearance of display devices, more and more display panels have their conventionally rectangular display regions replaced with ones in other shapes than a rectangle.

Such a display panel has, for example, four corners rounded off to be round corners. In order to correspond to the round corners, the display region of the display panel has an outer edge whose four corners are also curved to be round corners. In the display panel, a drive circuit such as a gate driver and an emission driver is disposed on one of frame sides; namely, sides adjacent to the round corners of the display panel. This is because in the frame region, the drive circuit is to be placed behind a barrier wall and along an outer periphery of a round corner of the display region. Other than that, as disclosed in Patent Document 1, the drive circuit is also disposed on a frame corner included in a round corner of the display panel.

CITATION LIST

Patent Literature

[Patent Document 1] Japanese Unexamined Patent Application Publication No. 2017-134339

SUMMARY OF INVENTION

Technical Problem

In the above display device, the four corners of the display panel are rounded off. Hence, in the four frame corners, a crack is likely to appear in an inorganic insulating film of an active element layer included in the display panel. The crack in the inorganic insulating film of the active element layer is a matter of concern because water might enter the display region from the crack. In order to prevent the crack from opening, a length between an outer end edge and the barrier wall of the frame region in the display panel could be left longer on a frame corner than on a frame side.

However, in the case where the drive circuit is disposed on a frame corner along an outer periphery of a round corner of the display region as disclosed in Patent Document 1, a relatively long distance has to be left between the display region and the barrier wall on the frame corner. In such a case, for providing the drive circuit, either the frame region has to be enlarged in the round corner, or the distance between the outer end edge and the barrier wall of the frame region has to be diminished. The former measure keeps the frame region of the display panel from downsizing. Meanwhile, the latter measure could cause the crack described above.

A technique of the present disclosure is devised in view of the above problems, and is intended to provide a display device including a display panel whose shape allows a frame region to downsize in a round corner.

Solution to Problems

A display device according to a technique of the present disclosure includes: a base substrate; an active element layer including a plurality of active elements, a plurality of display wires, and a drive circuit all of which are provided above the base substrate; a light-emitting element layer including a plurality of light-emitting elements provided on the active element layer; and a sealing layer including an organic film provided to cover the light-emitting element layer. The base substrate, the active element layer, the light-emitting element layer, and the sealing layer constitute a display panel including: a display region displaying an image; a frame region provided to surround the display region; and at least one round corner having a curved outline in plan view. The display region is provided with the display wires including: a plurality of gate wires extending in parallel with one another in a first direction; a plurality of emission control wires extending in parallel with the gate wires; and a plurality of source wires extending in a second direction intersecting with the gate wires and the emission control wires. The light-emitting elements are each included in a pixel circuit provided for each of intersections of the gate wires and the source wires. The frame region is provided with: the drive circuit including a gate driver configured to output a gate signal to the gate wires, and an emission driver configured to output an emission control signal to the emission control wires; and a barrier wall surrounding the organic film. The frame region includes: a frame corner including the at least one round corner of the display panel; and two sides provided so that the frame corner is sandwiched between the two sides. The two sides include a first frame side in parallel with the gate wires, and a second frame side in parallel with the source wires. At least one of the gate driver and the emission driver is divided and provided to the first frame side and the second frame side. A length between the display region and the barrier wall in at least a portion of the frame corner is shorter than a length between the display region and the barrier layer in the first frame side.

Advantageous Effects of Invention

In the above display device, at least one of the gate driver and the emission driver serving as a drive circuit is divided and provided to the first frame side and the second frame side provided to sandwich therebetween a frame corner included in a round corner of the display panel in the frame region. Such a feature makes it possible to eliminate, or reduce, drive circuits that should be disposed in the frame corner. Hence, the feature can reduce a length between the display region and the barrier wall on the frame corner. Moreover, the length between the display region and the barrier wall in at least a portion of the frame corner is shorter than the length between the display region and the barrier wall in the first frame side. Such a feature allows the frame region to downsize in the round corner of the display panel.

DESCRIPTION OF EMBODIMENTS

Described below in derail are exemplary embodiments, with reference to the drawings.

Note that, in the embodiments below, a statement to read that a constituent feature such as a film, a layer, and an element is provided on or above an other constituent feature such as an other film, an other layer, and an other element not only means that the constituent feature is directly on the other constituent feature, but also means that still an other constituent feature such as still an other film, still an other layer, and still an other element is provided between the constituent feature and the other constituent feature.

Moreover, in the embodiments below, a statement to read that a constituent feature such as a film, a layer, and an element is connected to an other constituent feature such as an other film, an other layer, and an other element means that the constituent features are electrically connected together unless otherwise specified. Unless departing from the technical scope of the present disclosure, the electrical connection means not only direct connection but also indirect connection through still an other constituent feature such as still an other film, still an other layer, and still an other element. The electrical connection also means that the constituent feature and the other constituent feature are combined together; that is, a portion of the constituent feature serves as the other constituent feature.

Furthermore, in the embodiments below, the term "same layer" means that a constituent feature and a comparative constituent feature such as films and layers are formed in the same process. The term "lower layer (or layer below)" means that a constituent feature such as a film, a layer, and an element is formed in a previous process before a comparative constituent feature such as a film, a layer, and an element is formed. The term "upper layer (or layer above)" means that a constituent feature such as a film, a layer, and an element is formed in a successive process after a comparative constituent feature such as a film, a layer, and an element is formed.

First Embodiment

Figure 1:
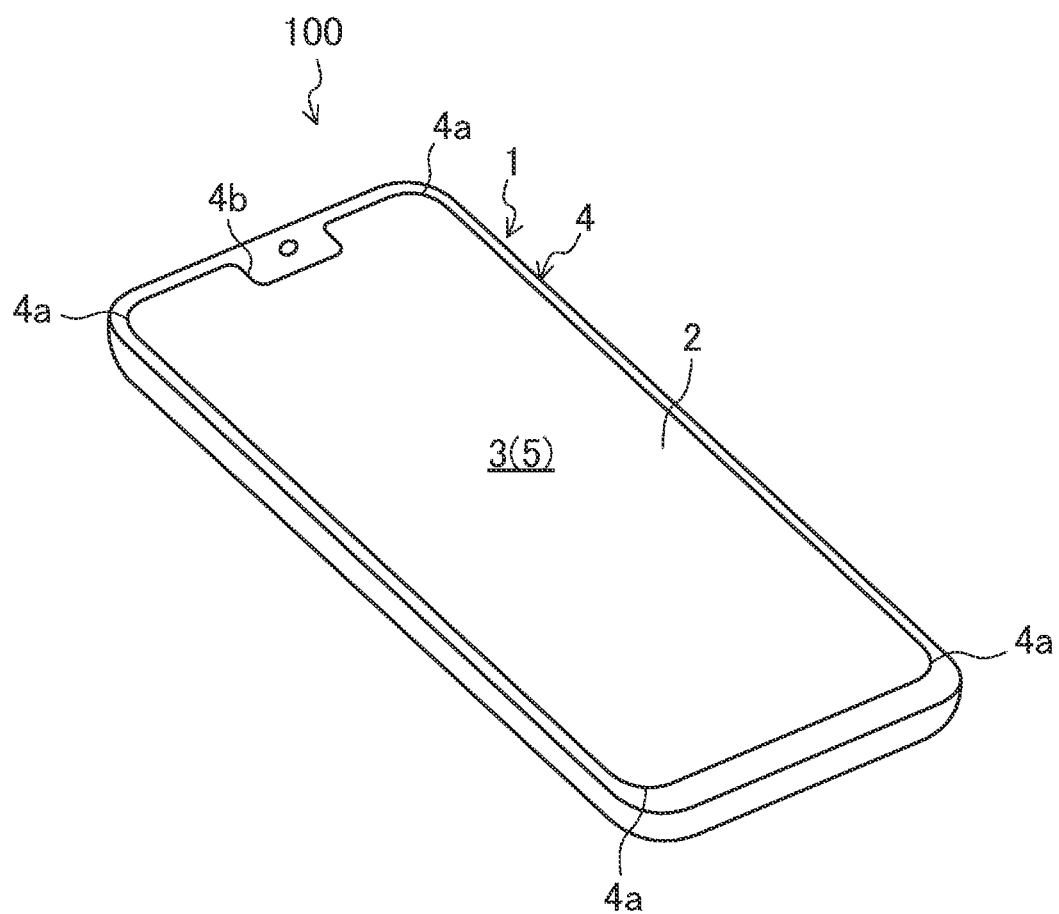
FIG. 1 is a perspective view of an information terminal including an organic EL display device according to a first embodiment.
Figure 2:
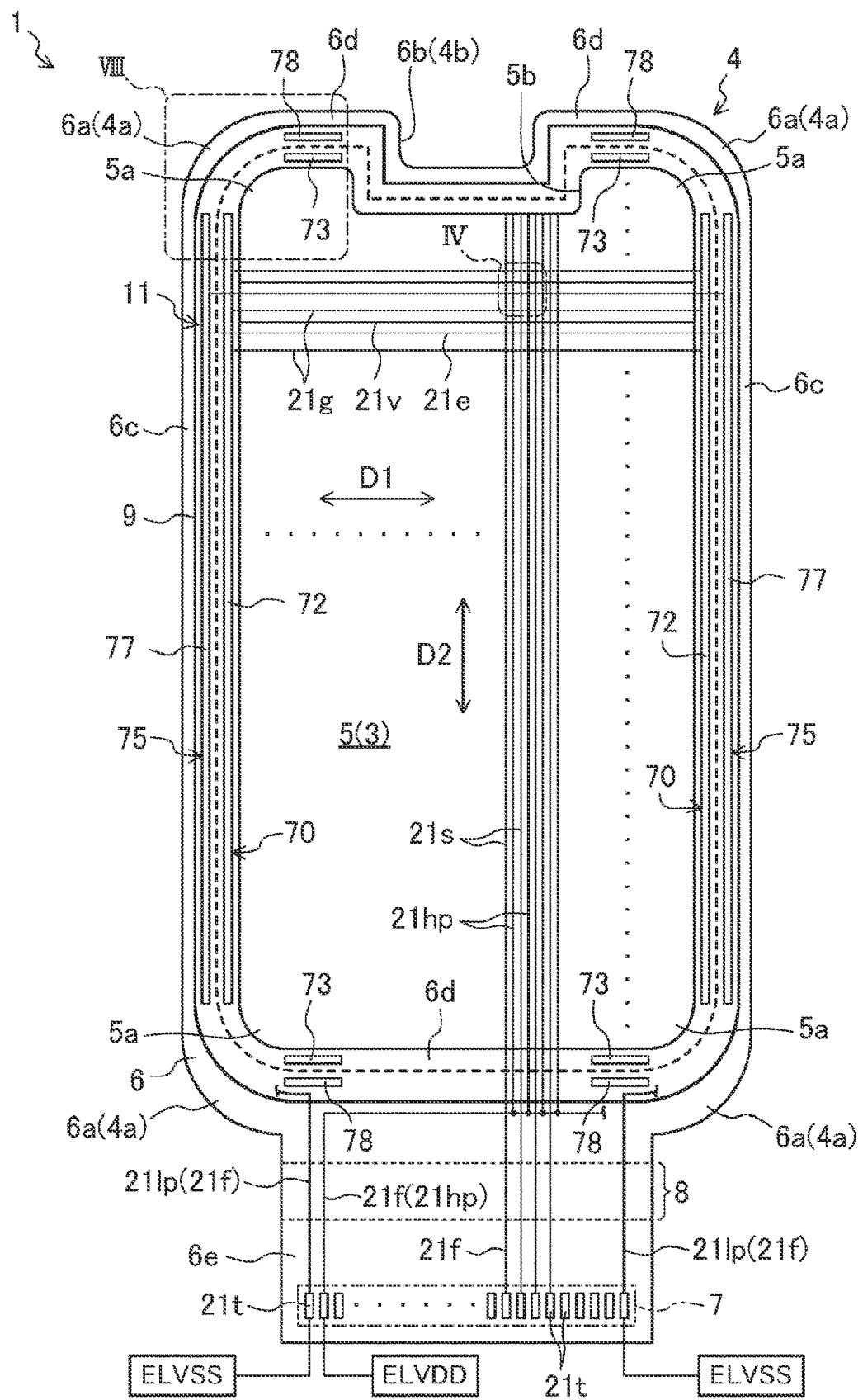
FIG. 2 is a plan view illustrating a schematic configuration of a display panel included in the organic EL display device according to the first embodiment.
Figure 3:
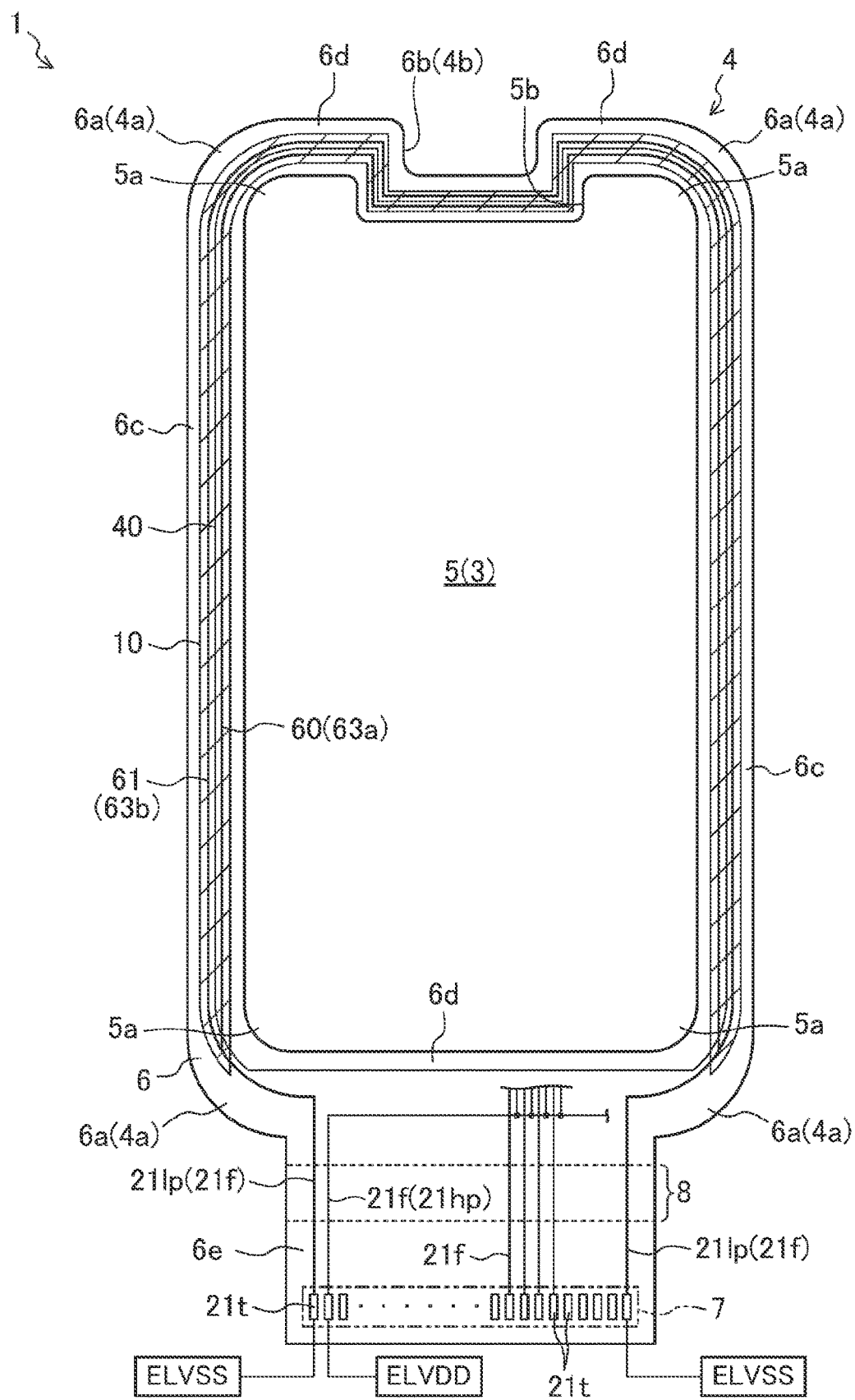
FIG. 3 is a plan view illustrating a schematic configuration of the display panel included in the organic EL display device according to the first embodiment.
Figure 4:
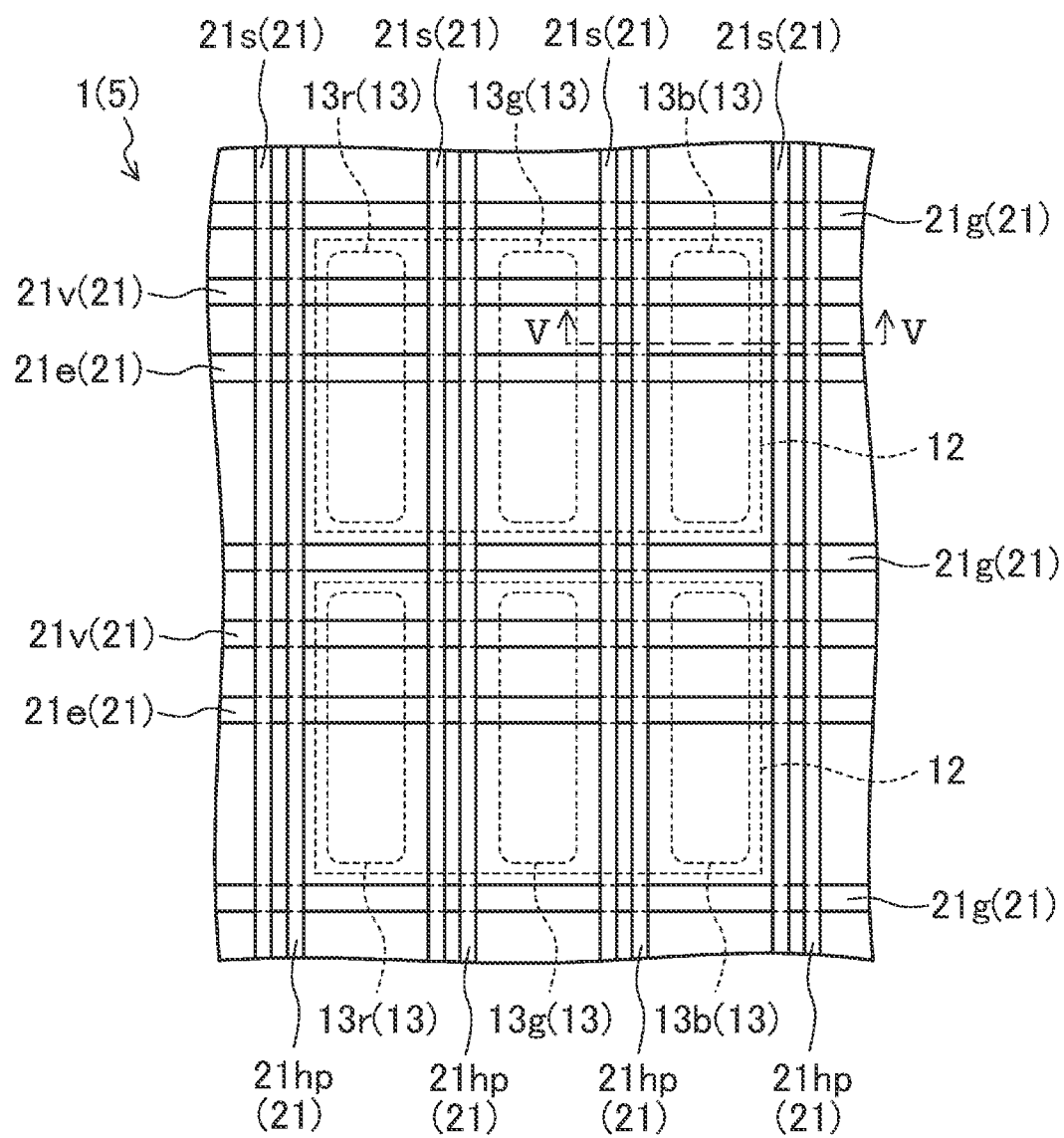
FIG. 4 is a plan view illustrating a portion of a display region of the display panel, the portion being circled in line IV of FIG. 2.
Figure 5:
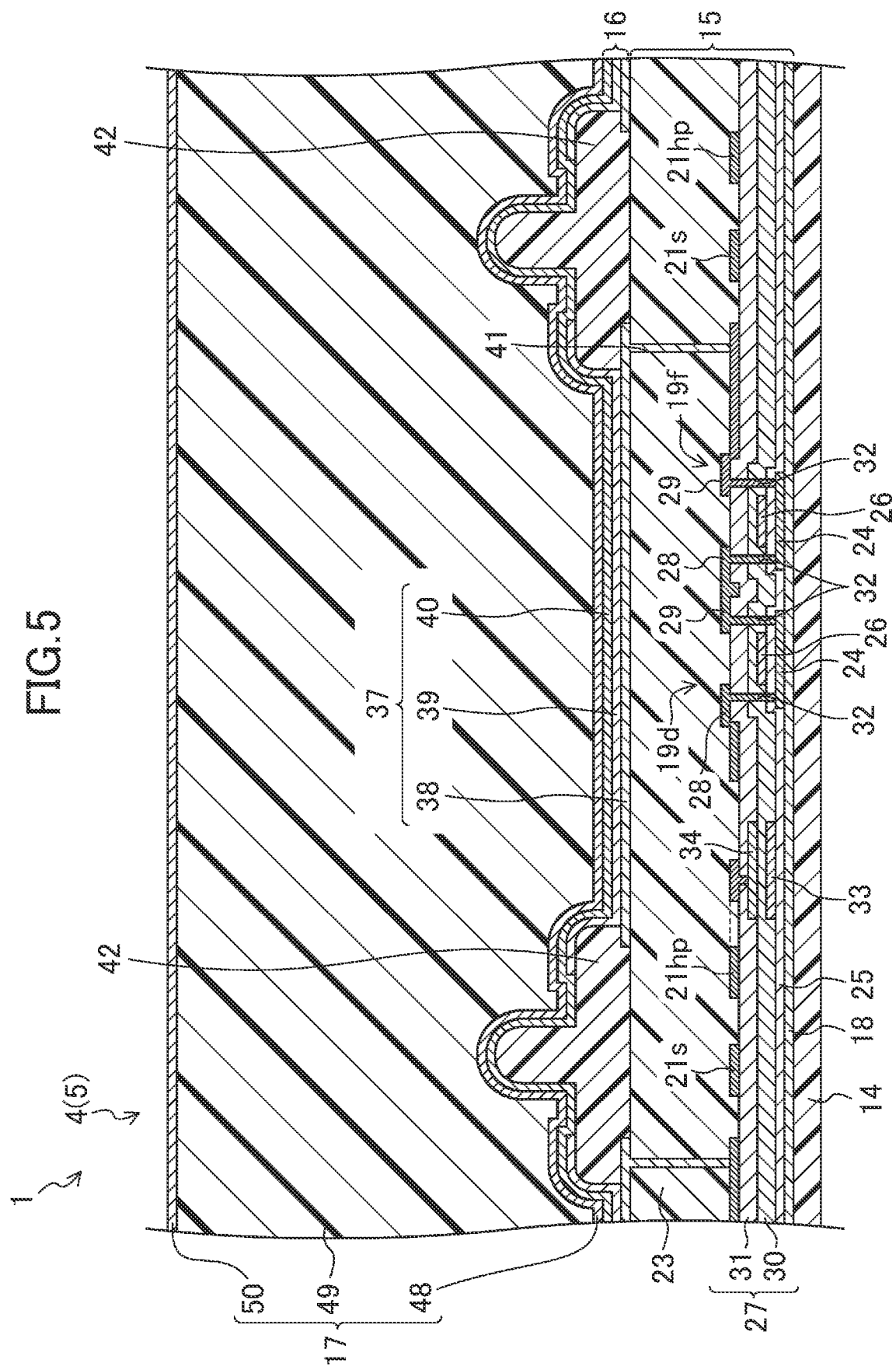
FIG. 5 is a cross-sectional view illustrating a schematic configuration of a portion of the display region, taken from line V-V of FIG. 4.
Figure 6:
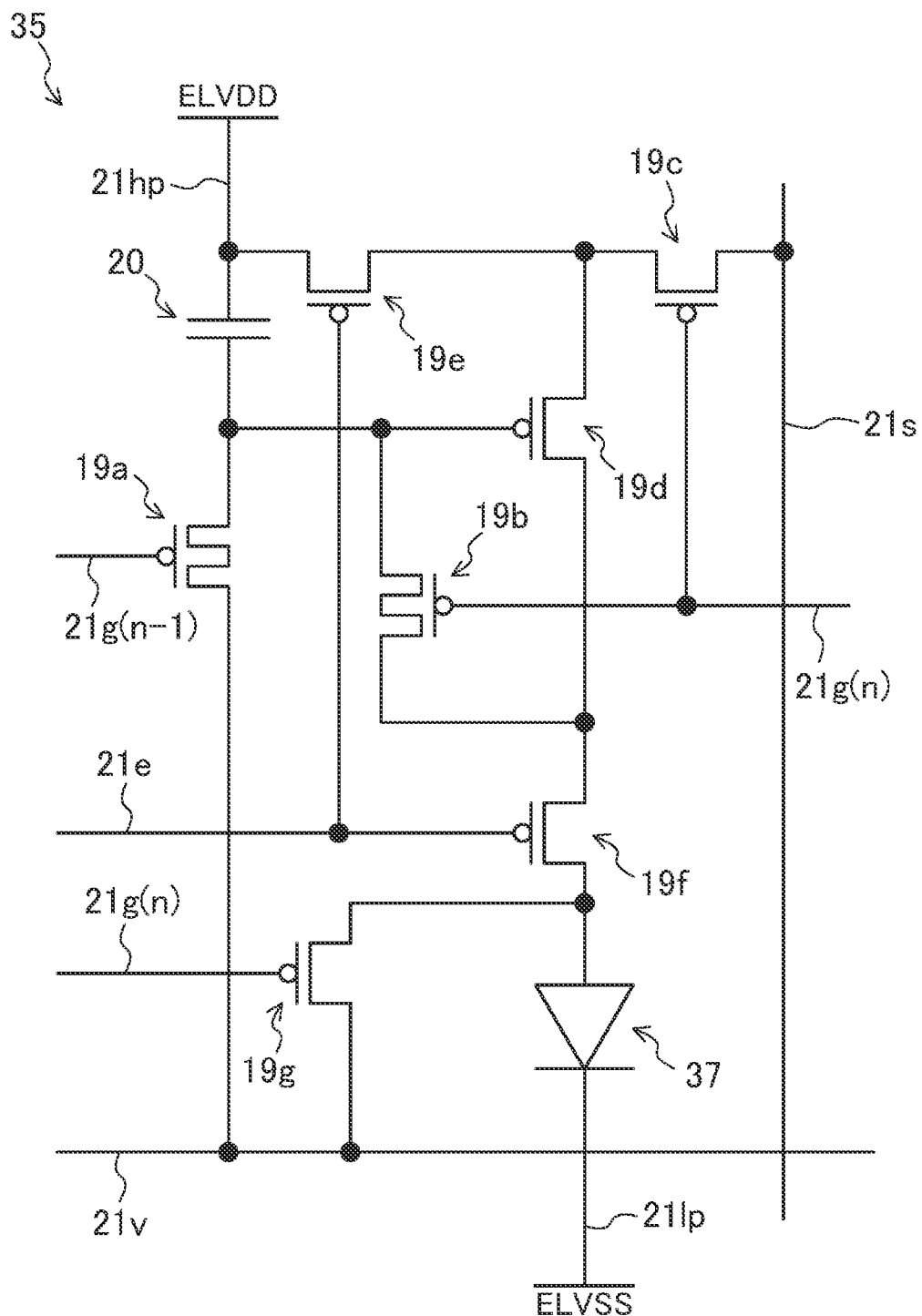
FIG. 6 is an equivalent circuit diagram of a pixel circuit provided to the display panel included in the organic EL display device according to the first embodiment.
Figure 7:
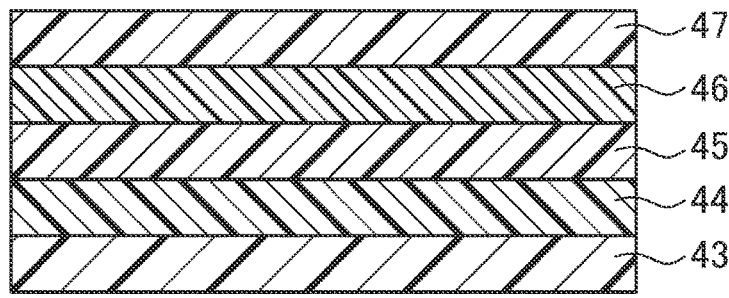
FIG. 7 is a cross-sectional view illustrating a multilayer structure of an organic EL layer provided to the display panel included in the organic EL display device according to the first embodiment.
Figure 8:
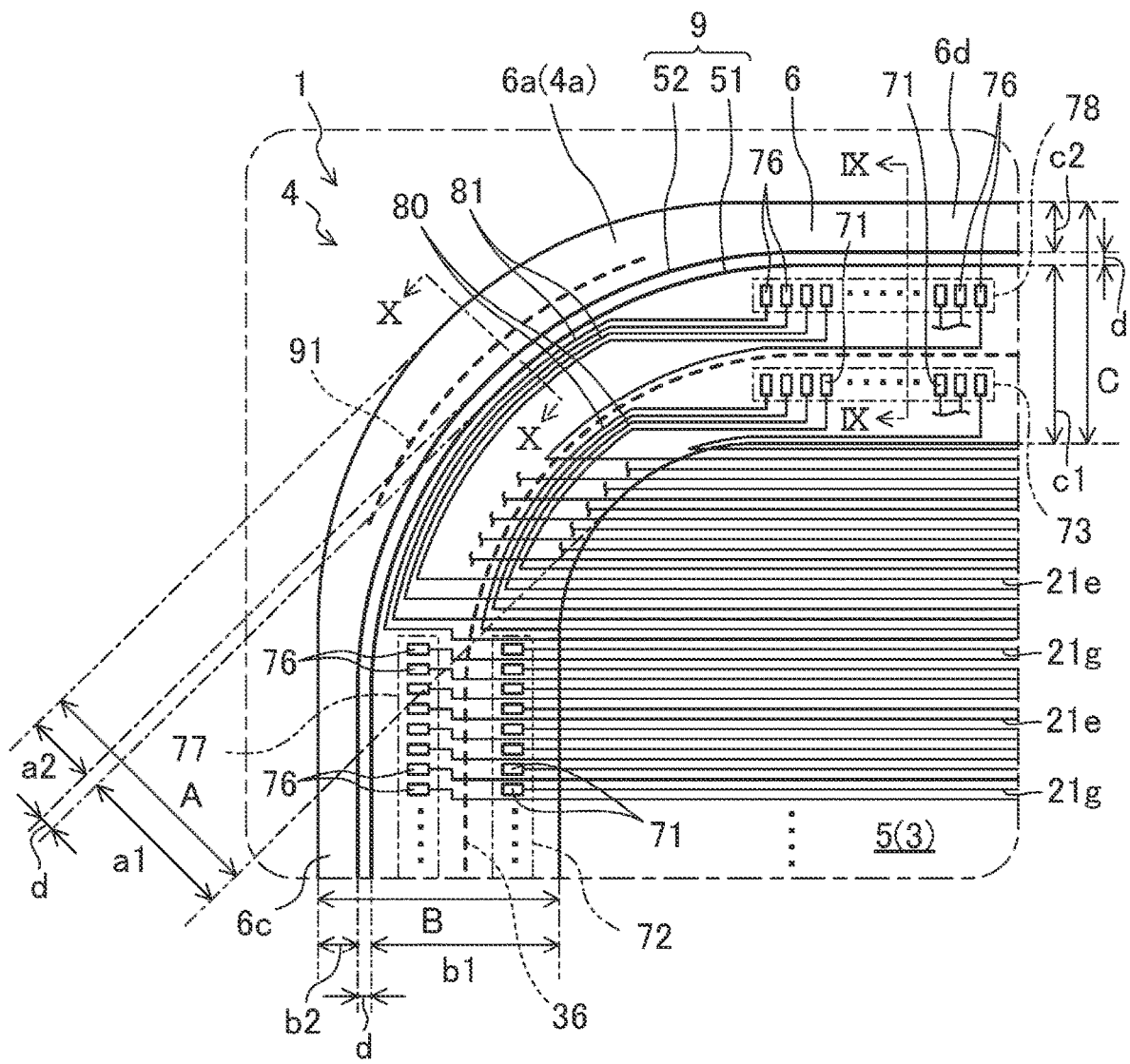
FIG. 8 is a plan view illustrating a schematic configuration of and around a round corner, of the display panel, circled in line VIII of FIG. 2.
Figure 9:
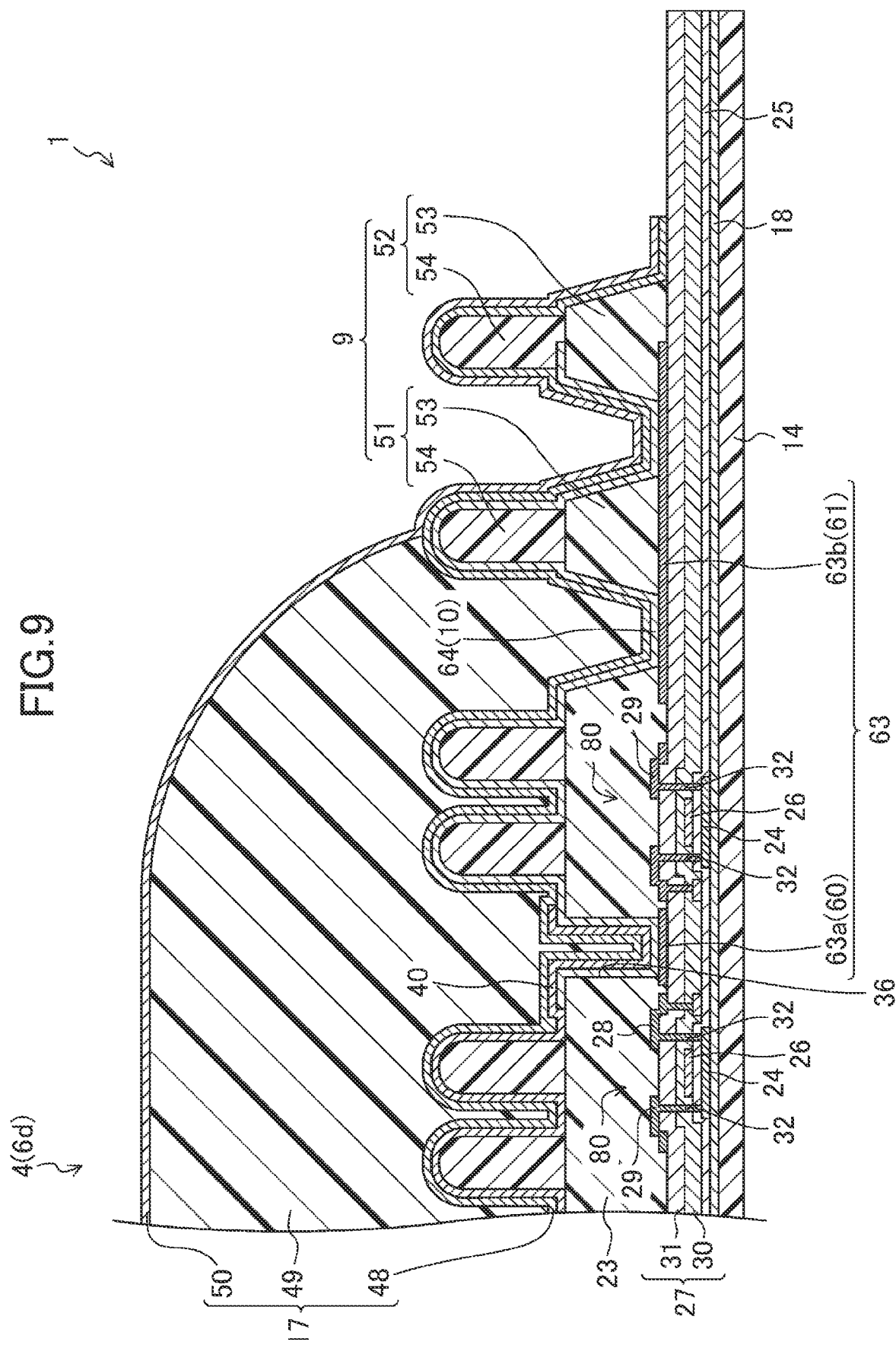
FIG. 9 is a cross-sectional view of a frame region of the display panel, taken from line IX-IX of FIG. 8.
Figure 10:
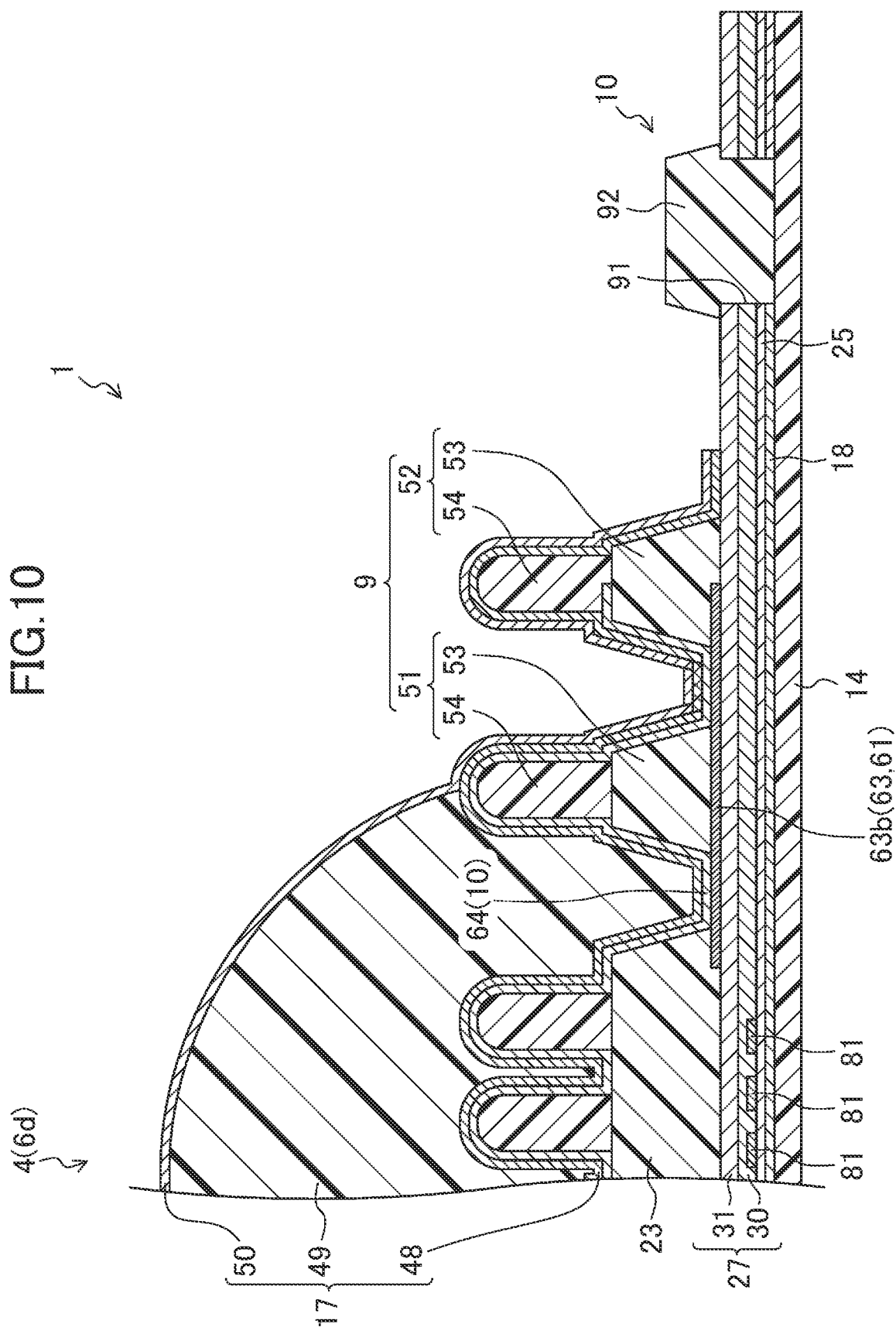
FIG. 10 is a cross-sectional view of the frame region of the display panel, taken from line X-X of FIG. 8.

FIG. 1 is a perspective view of an information terminal 100 including an organic EL display device 1 according to a first embodiment. FIGS. 2 and 3 are plan views illustrating schematic configurations of a display panel 4 included in the organic EL display device 1. FIG. 4 is a plan view illustrating a portion of a display region 5 of the display panel 4. The portion is circled in line IV of FIG. 2. FIG. 5 is a cross-sectional view illustrating a schematic configuration of a portion of the display region 5, taken from line V-V of FIG. 4. FIG. 6 is an equivalent circuit diagram of a pixel circuit 35 provided to the display panel 4. FIG. 7 is a cross-sectional view illustrating a multilayer structure of an organic EL layer 39 provided to the display panel 4. FIG. 8 is a plan view illustrating a schematic configuration of and around a round corner 4a, of the display panel 4, circled in line VIII of FIG. 2. FIG. 9 is a cross-sectional view of a frame region 6 of the display panel 4, taken from line IX-IX of FIG. 8. FIG. 10 is a cross-sectional view of the frame region 6 of the display panel 4, taken from line X-X of FIG. 8.

Schematic Configuration of Organic EL Display Device

The organic EL display device 1 is a thin electronic device mounted on an information terminal 100 such as a mobile phone referred to as a smart phone illustrated in FIG. 1. The organic EL display device 1 includes a display surface 2 formed flat overall. The display surface 2 includes a screen 3 facing a user. The organic EL display device 1 includes the display panel 4 oriented vertically and including the screen 3. In this display panel 4, a transverse direction D1 on the screen 3 corresponds to a first direction, and a longitudinal direction D2 on the screen 3 corresponds to a second direction.

The display panel 4 is a flexible plate, and, as illustrated in FIGS. 2 and 3, is shaped to have an outline other than a rectangle in plan view. Specifically, the display panel 4 has four corners each of which is rounded off to be the round corner 4a having a curved outline in plan view. Furthermore, the display panel 4 is provided with a notch 4b shaped into a recess in a transverse middle of an upper side of the display panel 4. The notch 4b receives a component to be mounted, such as a camera module. This display panel 4 includes: a display region 5 displaying an image; and a frame region 6 positioned around the display region 5.

The display region 5, which is for the screen 3 of the display surface 2 in the display panel 4, is shaped to conform to the outline of the display panel 4. The display region 5 includes: a display corner 5a having an outline curved in plan view and provided to correspond to the round corner 4a of the display panel 4; and a display notch 5b shaped into a recess and provided to correspond to the notch 4b of the display panel 4. Moreover, the frame region 6 is a non-display region; that is, a region other than the screen 3 of the display surface 2 in the display panel 4. The frame region 6 includes: a frame corner 6a included in the round corner 4a of the display panel 4; and a frame notch 6b included in the notch 4b of the display panel 4.

This frame region 6 includes sides so that each frame corner 6a is sandwiched between two of the sides. The two sides include a first frame side 6c in parallel with the longitudinal direction, and a second frame side 6d in parallel with the transverse direction. The first frame side 6c includes both of the right and left sides of the frame region 6. The second frame side 6d includes: an upper side, of the frame region 6, between the frame corner 6a and the frame notch 6b; and a lower side, of the frame region 6, between the frame corners 6a adjacent to each other.

The frame region 6 further includes an extension 6e extending from the second frame side 6d positioned below the screen 3. The extension 6e has an end provided with a terminal unit 7 for connecting to an external circuit. Connected to the terminal unit 7 is such a not-shown wiring substrate as a flexible printed circuit (FPC) on which a display control circuit is mounted. Moreover, the frame region 6 between the display region 5 and the terminal unit 7 is provided with a folding portion 8 to be folded so that the terminal unit 7 is disposed to the back of the device.

Furthermore, the frame region 6 is provided with: a barrier structure 9 to surround the display region 5; and a plurality of routed wires 21f connected to a cathode (a second electrode 40) of an organic EL element 37 and to display wires 21 provided inside the display region 5. The routed wires 21f include a source wire 21s, a high-level power source wire 21hp, and a low-level power source wire 21lp. The cathode of the organic EL element 37 and the low-level power source wire 21lp are electrically connected together in a connecting conductor 10 (a hatched area in FIG. 3) provided to the frame region 6. The terminal unit 7 includes wiring terminals 21t arranged in a predetermined pattern so that each of the wiring terminals 21t is electrically connected to a corresponding one of the routed wires 21f. The frame region 6 behind the barrier structure 9 is provided with a drive circuit 11 as a monolithic circuit for driving the display panel 4.

The display region 5, which is for the screen 3 of the display surface 2 in the display panel 4, includes a plurality of pixels 12 illustrated in FIG. 4. The pixels 12 are arranged in a matrix. Each of the pixels 12 includes, for example, sub-pixels 13 in three colors such as: a sub-pixel 13r presenting a tone in red; a sub-pixel 13g presenting a tone in green; and a sub-pixel 13b presenting a tone in blue. These sub-pixels 13r, 13g, and 13b in three colors are arranged, for example, in a pattern of stripes.

The display panel 4 adopts active matrix driving in which an active element causes the individual sub-pixels 13r, 13g, and 13b to present the tones. As illustrated in FIG. 5, this display panel 4 includes: a resin substrate layer 14; an active element layer 15 provided on the resin substrate layer 14; a light-emitting element layer 16 provided on the active element layer 15; and a sealing layer 17 provided to cover the light-emitting element layer 16. Attached on a front face of this display panel 4 is a functional film (not shown) having such functions as optical compensation, touch sensing, and protection. Moreover, a protective film (not shown) is attached on a back face of the display panel 4.

Configuration of Resin Substrate Layer

The resin substrate layer 14 is flexible and formed of a multilayer film including: a resin film made of such organic materials as polyimide resin, polyamide resin, epoxy resin, acrylic resin, and polysiloxane resin; and an inorganic insulating film made of such inorganic materials as silicon oxide ($SiO_x$), silicon nitride ($SiN_x$), silicon oxide nitride ($SiO_xN_y$; x>y: hereinafter, x and y are positive numbers), and silicon nitride oxide ($SiN_xO_y$; x>y). This resin substrate layer 14, made of resin, is an example of a base substrate.

Configuration of Active Element Layer

The active element layer 15 includes: a base coat film 18 provided on the resin substrate layer 14; a plurality of thin-film transistors (TFTs) 19 provided on the base coat film 18; a plurality of capacitors 20; the display wires 21 of various kinds; the drive circuit 11 including drive circuits 11 of various kinds; and a planarization film 23 provided to cover the TFTs 19, the capacitors 20, the display wires 21 and the drive circuits 11. Here, the TFTs 19 are an example of an active element.

The base coat film 18 is either a monolayer film of an inorganic insulating layer made of such materials as silicon oxide (SiO), silicon nitride ($SiN_x$), silicon oxide nitride ($SiO_xN_y$; x>y), and silicon nitride oxide ($SiN_xO_y$; x>y), or a multilayer film of two or more inorganic insulating layers made of these materials. The TFTs 19 and each capacitor 20 are provided for one of the sub-pixels 13.

As illustrated in FIGS. 2 and 3, the display region 5 is provided with the display wires 21 including: a plurality of gate wires 21g transmitting a gate signal; an emission control wire 21e transmitting an emission control signal; an initialization voltage wire 21v supplying an initialization voltage; the source wire 21s including a plurality of source wires 21s transmitting a source signal; and the high-level power source wire 21hp including a plurality of high-level power source wires 21hp supplying a current to the organic EL element 37. The frame region 6 includes: the routed wires 21f electrically connected to the display wires 21 provided inside the display region 5; and a plurality of control wires (not shown) including a clock signal wire and a start pulse signal wire for controlling operation of the drive circuits 11. In the display region 5, the display wires 21 of the same kinds (the gate wires 21g, the emission control wires 21e, the source wires 21s, and the high-level power source wires 21hp) extend in parallel with one an other.

The gate wires 21g extend in parallel with one an other in the transverse direction D1 (the first direction) along the side provided with the terminal unit 7. The emission control wire 21e including a plurality of emission control wires 21e and the initialization voltage wire 21v including a plurality of initialization voltage wires 21v extend in parallel with one an other along the gate wires 21g. The source wires 21s extend in parallel with one an other in the longitudinal direction D2 (the second direction) intersecting with the gate wires 21g and the emission control wires 21e. The high-level power source wires 21hp extend in parallel with one an other along the source wires 21s.

The gate wires 21g and the emission control wires 21e are formed in the same layer and of the same material. The source wires 21s and the high-level power source wires 21hp are formed in the same layer and of the same material. The initialization voltage wires 21v alone are formed in a separate layer from the layers of the display wires 21g, 21e, 21s, and 21hp. The gate wires 21g, the emission control wires 21e, the initialization voltage wires 21v the source wires 21s, and the high-level power source wires 21hp are insulated from one an other, and are formed into a lattice on the whole.

Of these display wires 21, the gate wires 21g and the source wires 21s define the sub-pixels 13.

The TFTs 19 include: a first TFT 19a; a second TFT 19b; a third TFT 19c; a fourth TFT 19d; a fifth TFT 19e; a sixth TFT 19f; and a seventh TFT 19g (see FIG. 6). Each of these first to seventh TFTs 19a to 19g is a p-channel thin-film transistor of, for example, a top gate structure.

Specifically, each of these first to seventh TFTs 19a to 19g includes: a semiconductor layer 24 shaped into an island and provided on the base coat film 18; a gate insulating film 25 provided to cover the semiconductor layer 24; a gate electrode 26 overlapping a portion (a channel region) of the semiconductor layer 24; an interlayer insulating film 27 provided to cover the gate electrode 26; and a source electrode 28 and a drain electrode 29 provided on the interlayer insulating film 27. FIG. 5 illustrates the fourth ITT 19d and the sixth TFT 19f alone. Meanwhile, the first TFT 19a, the second TFT 19b, the third TFT 19c, the fifth TFT 19e, and the seventh TFT 19g are similar in configuration to the fourth TFT 19d and the sixth TFT 19f. Moreover, in the example illustrated in FIG. 5, the fourth TFT 19d and the sixth TFT 19f are connected together through the source electrode 28 and the drain electrode 29. Whereas, the conductive region of the semiconductor layer 24 may be formed continuously.

The semiconductor layer 24 is formed of, for example, low-temperature polycrystalline (LTPS) and an oxide semiconductor. The gate insulating film 25 is either a monolayer film of an inorganic insulating layer made of such materials as silicon oxide (SiOx), silicon nitride (SiN$_x$), silicon oxide nitride (SiO$_x$N$_y$; x>y), and silicon nitride oxide (SiN$_x$O$_y$; x>y), or a multilayer film of two or more inorganic insulating layers made of these materials.

The gate electrode 26 is either a monolayer film of a metal layer made of such metals as aluminum (Al), tungsten (W), molybdenum (Mo), tantalum (Ta), chromium (Cr), titanium (Ti), and copper (Cu), or a multilayer film of two or more metal layers made of these metals. The gate wires 21g and the emission control wires 21e are formed in the same layer, and of the same material, as this gate electrode 26 is.

The interlayer insulating film 27 is a multilayer film including a first interlayer insulating film 30 and a second interlayer insulating film 31. Each of the first interlayer insulating film 30 and the second interlayer insulating film 31 is either a monolayer film of an inorganic insulating layer made of such materials as silicon oxide (SiO$_x$), silicon nitride (SiN$_x$), silicon oxide nitride (SiO$_x$N$_y$; x>y), and silicon nitride oxide (SiN$_x$O$_y$; x>y), or a multilayer film of two or more inorganic insulating layers made of these materials.

The source electrode 28 and the drain electrode 29 spaced apart from each other are positioned to sandwich therebetween a region (a channel region), of the semiconductor layer 24, overlapped with the gate electrode 26, and are connected to respective portions (a source region and a drain region) of the semiconductor layer 24 through respective contact holes 32 formed in the gate insulating film 25 and the interlayer insulating film 27. Each of the source electrode 28 and the drain electrode 29 is either a monolayer film of a metal layer made of such metals as aluminum (Al), tungsten (W), molybdenum (Mo), tantalum (Ta), chromium (Cr), titanium (Ti), and copper (Cu), or a multilayer film of two or more metal layers made of these metals. The source wires 21s and the high-level power source wires 21hp are formed in the same layer, and of the same material, as the source electrode 28 and the drain electrode 29 are.

Each of the capacitors 20 includes: a lower layer electrode 33 provided on the gate insulating film 25; the first interlayer insulating film 30 provided to cover the lower layer electrode 33; and an upper layer electrode 34 to overlap the lower layer electrode 33 through the first interlayer insulating film 30. The lower layer electrode 33 is formed in the same layer, and of the same material, as the gate wires 21g and the gate electrode 26 are. The upper layer electrode 34 is either a monolayer film of a metal layer made of such metals as aluminum (Al), tungsten (W), molybdenum (Mo), tantalum (Ta), chromium (Cr), titanium (Ti), and copper (Cu), or a multilayer film of two or more metal layers made of these metals. The initialization voltage wire 21v is formed in the same layer, and of the same material, as this upper layer electrode 34 is.

The first to seventh TFTs 19a to 19g, the capacitor 20, a gate wire 16g, an emission control wire 16e, an initialization voltage wire 16v, a source wire 16s, and a high-level power source wire 16hp all of which are included in the active element layer 15, and the organic EL element 37 included in the light-emitting element layer 16 constitute the pixel circuit 35 illustrated in FIG. 6. The pixel circuit 35 is provided for each of the intersections of the gate wires 21g and the source wires 21s, and serves as the sub-pixel 13.

Described below is a configuration of one of such pixel circuits 35. Note that, in the description of the one pixel circuit 35, a gate wire 21g corresponding to the one pixel circuit 35 is referred to as a "corresponding gate wire" and denoted by a reference sign "21g (n)." In the scanning order of gate wires 21g, a gate wire 21g immediately before the corresponding gate wire 21g (n) is referred to as a "preceding gate wire" and denoted by a reference sign "21g (n−1)." Moreover, an emission control wire 21e and an initialization voltage wire 21v corresponding to the one pixel circuit 35 are respectively referred to as a "corresponding emission control wire" and a "corresponding initialization voltage wire," A source wire 21s and a high-level power source wire 21hp corresponding to the one pixel circuit 35 are respectively referred to as a "corresponding source wire" and a "corresponding high-level power source wire." Moreover, in the first to seventh TFTs 19a, to 19g, the gate electrode 26 corresponds to a control terminal, one of the source electrode 28 and the drain electrode 29 corresponds to a first conductive terminal, and the other one of the source electrode 28 and the drain electrode 29 corresponds to a second conductive terminal.

In the pixel circuit 35, the first TFT 19a is an initialization transistor provided among the preceding gate wire 21g (n−1), the initialization voltage wire 21v, and the capacitor 20, and functions as a switching element. The first TFT 19a has the control terminal connected to the preceding gate wire 21g (n−1), the first conductive terminal connected to the initialization voltage wire 21v, and the second conductive terminal connected to the lower electrode 33 of the capacitor 20. In response to selection of the preceding gate wire 21g (n−1), this first TFT 19a applies a voltage of the initialization voltage wire 21v to the capacitor 20 to initialize a voltage to be applied to the gate electrode 26 of the fourth TFT 19d.

The second TFT 19b is a compensation transistor provided between the corresponding gate wire 21g (n) and the fourth TFT 19d, and functions as a switching element. The second TFT 19b has the control terminal connected to the corresponding gate wire 21g (n), the first conductive terminal connected to the second conductive terminal of the fourth TFT 19d, and the second conductive terminal connected to the control terminal of the fourth TFT 19d. In response to selection of the corresponding gate wire 21g (n), this second TFT 19b switches the fourth TFT 19d to a diode-connected state to compensate a threshold voltage of the fourth TFT 19d.

The third TFT 19c is a write transistor provided among the corresponding gate wire 21g (ii), a corresponding source wire 21s, and the fourth TFT 19d, and functions as a switching element. The third TFT 19c has the control terminal connected to the corresponding gate wire 21g (n), the first conductive terminal connected to the corresponding source wire 21s, and the second conductive terminal connected to the first conductive terminal of the fourth TFT 19d. In response to selection of the corresponding gate wire 21g (n), this third TFT 19c applies a voltage of the corresponding source wire 21s to the first conductive terminal of the fourth ITT 19d.

The fourth TFT 19d is a drive transistor provided among: the first TFT 19a, the second TFT 19b, and the capacitor 20; the third TFT 19c and the fifth TFT 19e; and the sixth TFT 19f. The fourth TFT 19d has the control terminal connected to the second conductive terminal of the second TFT 19b and to the lower layer electrode 33 of the capacitor 20, the first conductive terminal connected to the second conductive terminal of the third TFT 19c and to the second conductive terminal of the fifth TFT 19e, and the second conductive terminal connected to the first conductive terminal of the second TFT 19b and to the first conductive terminal of the sixth TFT 19f. This fourth TFT 19d applies, to the first conductive terminal of the sixth TFT 19f, a drive current in accordance with a voltage to be applied between the control terminal and the first conductive terminal of the fourth TFT 19d.

The fifth TFT 19e is a power source transistor provided among a corresponding emission control wire 21e, a corresponding high-level power source wire 21hp, and the fourth ITT 19d, and functions as a switching element. The fifth TFT 19e has the control terminal connected to the corresponding emission control wire 21e, the first conductive terminal connected to the corresponding high-level power source wire 21hp, and the second conductive terminal connected to the first conductive terminal of the fourth TFT 19d. In response to selection of the corresponding emission control wire 21e, this fifth TFT 19e applies a voltage of the corresponding high-level power source wire 21hp to the first conductive terminal of the fourth TFT 19d.

The sixth TFT 19f is a light emission control transistor provided among: the corresponding emission control wire 21e; the second TFT 19b and the fourth TFT 19d; and the organic EL element 37, and functions as a switching element. The sixth TFT 19f has the control terminal connected to the corresponding emission control wire 21e, the first conductive terminal connected to the second conductive terminal of the fourth TFT 19d, and the second conductive terminal connected to an anode (a first electrode 38) of the organic EL element 37. In response to selection of the corresponding emission control wire 21e, this sixth TFT 19f applies the drive voltage to the organic EL element 37.

The seventh TFT 19g is an anode discharge transistor provided between the corresponding gate wire 21g (n), the corresponding initialization voltage wire 21v, and the organic EL element 37, and functions as a switching element. The seventh TFT 19g has the control terminal connected to the corresponding gate wire 21g (n), the first conductive terminal connected to the corresponding initialization voltage wire 21v, and the second conductive terminal connected to the anode (the first electrode 38) of the organic EL element 37. In response to selection of the corresponding gate wire 21g (n), this seventh TFT 19g resets charge accumulated in the anode of the organic EL element 37.

The capacitor 20 is a data holding element provided between the corresponding high-level power source wire 21hp and the first and fourth TFTs 19a and 19d. The capacitor 20 has: the lower layer electrode 33 connected to the control terminal of the fourth TFT 19d, to the second conductive terminal of the first TFT 19a, and to the second terminal of the second. TFT 19b; and the upper layer electrode 34 connected to the corresponding high-level power source wire 21hp. When the corresponding gate wire 21g (n) is in a selected state, this capacitor 20 is charged with a voltage (in a precise sense, a voltage different by the threshold voltage of the fourth TFT 19d) of the corresponding source wire 21s. The capacitor 20 holds the voltage written by the charge to maintain the voltage applied to the control terminal of the fourth TFT 19d when the corresponding gate wire 21g (n) is in a non-selected state.

In the display region 5, the planarization film 23 illustrated in FIG. 5 provides a cover except a portion of the drain electrode 29 of the sixth TFT 19f in order to planarize an uneven front face, of the active element layer 15, due to the shapes of the front faces of the first to seventh TFTs 19a to 19g. The planarization film 23 is formed of such an organic material as photosensitive polyimide resin.

In the frame region 6, this planarization film 23 includes a trench 36 formed through the planarization film 23. This trench 36 is provided to three of the sides of the frame region 6 except the second frame side 6d toward the terminal unit 7; that is, the trench 36 is provided to the frame corner 6a, the frame notch 6b, and the second frame side 6d all of which are above the screen; and to the first frame sides 6c on both the right and the left, in order to surround the display region 5. The trench 36, extending along the outer periphery of the display region 5, separates the planarization film 23 into the inside and the outside in the frame region 6 to keep an impurity such as water from reaching the display region 5.

Configuration of Light-Emitting Element Layer

The light-emitting element layer 16 is provided on the planarization film 23 and included in the display region 5. This light-emitting element layer 16 includes a plurality of organic EL elements 37 including the organic EL element 37 and each provided for one of the sub-pixels 13. Here, the organic EL elements 37 are an example of a light-emitting element.

The organic EL element 37 is of, for example, a top emission structure. Specifically, the organic EL element 37 includes: the first electrode 38 provided on the front face of the planarization film 23; the organic EL layer 39 provided on the first electrode 38; and the second electrode 40 overlapping the first electrode 38 through the organic EL layer 39. Here, the organic EL layer 39 is an example of a light-emitting functional layer.

The first electrode 38 includes first electrodes 38 arranged in a matrix and each provided to one of the sub-pixels 13. Each first electrode 38 is connected, through a contact hole 41 formed in the planarization film 23, to the drain electrode 29 of the sixth TFT 19f of the corresponding sub-pixel 13. The first electrode 38 injects holes in the organic EL layer 39 and reflects light, and preferably is formed of a material having a high work function in order to improve efficiency in injecting the holes in the organic EL layer 39.

Example materials of the first electrode 38 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb).

Furthermore, example materials of the first electrode 38 may also be an alloy of magnesium (Mg) and copper (Cu), an alloy of magnesium (Mg) and silver (Ag), an alloy of sodium (Na) and potassium (K), an alloy of astatine (At) and astatine dioxide ($AtO_2$), an alloy of lithium (Li) and aluminum (Al), and an alloy of lithium (Li), calcium (Ca), and aluminum (Al).

Moreover, the first electrode 38 may also be formed of such conductive oxides as oxide (SnO), zinc oxide (ZnO), indium tin oxide (ITO), and indium zinc oxide (IZO). In addition, the first electrode 38 may be formed of two or more layers made of the above materials and stacked on top of an other. Note that examples of the materials having a high work function include indium tin oxide (ITO) and indium zinc oxide (IWO).

The neighboring first electrodes 38 are divided from each other by an edge cover 42 provided on the planarization film 23. The edge cover 42 is formed into a lattice and covers an outer periphery end of each first electrode 38. Example materials of the edge cover 42 include such inorganic compounds as silicon oxide, silicon nitride, and silicon oxynitride, and such organic materials as polyimide resin, acrylic resin, polysiloxane resin, and novolak resin.

The organic EL layer 39 is provided fix each of the sub-pixels 13. As illustrated in FIG. 7, this organic EL layer 39 includes a hole-injection layer 43, a hole-transport layer 44, a light-emitting layer 45, an electron-transport layer 46, and an electron-injection layer 47 stacked on top of an other in the stated order on the first electrode 38. Each of the hole-injection layer 43, the hole-transport layer 44, the light-emitting layer 45, the electron-transport layer 46, and the electron-injection layer 47 is patterned to be a thin film, using a film-forming mask. An example of the layers is a film formed by vacuum vapor deposition.

The hole-injection layer 43, also referred to as an anode buffer layer, brings energy levels of the first electrode 38 and the organic EL layer 39 closer to each other, and improves efficiency in injecting holes from the first electrode 38 into the organic EL layer 39. Examples of the hole-injection layer 43 include triazole derivatives, oxadiazole derivatives, imidazole derivatives, polyallylalkane derivatives, pyrazoline derivatives, phenylenediamine derivatives, oxazole derivatives, styrylanthracene derivatives, fluorenone derivatives, hydrazone derivatives, and stilbene derivatives.

The hole-transport layer 44 efficiently moves the holes to the light-emitting layer 45. Example materials of the hole-transport layer 44 include porphyrin derivatives, aromatic tertiary amine compounds, styrylamine derivatives, polyvinylcarbazole, poly-p-phenylene vinylene, polysilane, triazole derivatives, oxadiazole derivatives, imidazole derivatives, polyallylalkane derivatives, pyrazoline derivatives, pyrazolone derivatives, phenylenediamine derivatives, allylamine derivatives, amine-substituted culcon derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

When receiving a voltage from the first electrode 38 and the second electrode 40, the light-emitting layer 45 recombines the holes injected from the first electrode 38 and the electrons injected from the second electrode 40 together to emit light. For each of the sub-pixels 13, the light-emitting layer 45 is formed of a different material in accordance with colors (e.g. red, green, or blue) of light emitted from the organic EL element 37.

Example materials of the light-emitting layer 45 include metal oxinoid compounds [8-hydroxyquinoline metal complexes], naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron-transport layer 46 efficiently moves the electrons to the light-emitting layer 45. Example materials of the electron-transport layer 46 include, as organic compounds, oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The hole-injection layer 47, also referred to as a cathode buffer layer, brings energy levels of the second electrode 40 and the organic EL layer 39 closer to each other, and improves efficiency in injecting electrons from the second electrode 40 into the organic EL layer 39. Example materials of the electron-injection layer 47 include: such inorganic alkaline compounds as lithium fluoride (LiF), magnesium fluoride magnesium fluoride ($MgF_2$), calcium fluoride ($CaF_2$), strontium fluoride ($SrF_2$), and barium fluoride ($BaF_2$), aluminum oxide ($Al_2O_3$); and strontium oxide (SrO).

As illustrated in FIG. 4, the second electrode 40 is provided in common among the first electrodes 38 (i.e. in common among the sub-pixels 13), and covers the organic EL layer 39. This second electrode 40 is electrically connected to the low-level power source wire 21$l$p. Through the low-level power source wire 21$l$p, the second electrode 40 connects to a low-level voltage power source (ELVSS), using the wiring terminal 21$t$ provided to the terminal unit 7. The second electrode 40 injects electrons in the organic EL layer 39 and transmits light, and is preferably formed of a material having a low work function in order to improve efficiency in injecting the electrons in the organic layer 39.

Example materials of the second electrode 40 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb).

Furthermore, example materials of the second electrode 40 may also be an alloy of magnesium (Mg) and copper (Cu), an alloy of magnesium (Mg) and silver (Ag), an alloy of sodium (Na) and potassium (K), an alloy of astatine (At) and astatine dioxide ($AtO_2$), an alloy of lithium (Li) and aluminum (Al), and an alloy of lithium (Li), calcium (Ca), and aluminum (Al).

Moreover, the second electrode 40 may also be formed of such conductive oxides as tin oxide (SnO), zinc oxide (ZnO), indium tin oxide (ITO) and indium zinc oxide (IZO). In addition, the second electrode 40 may be formed of two or more layers made of the above materials and stacked on top of an other. Note that example materials having a low work function include magnesium (Mg), lithium (Li), lithium fluoride (LiF), an alloy of magnesium (Mg) and lithium fluoride (LiF), an alloy of magnesium (Mg) and silver (Ag), an alloy of sodium (Na) and potassium (K), an alloy of lithium (Li), calcium (Ca), and aluminum (Al), and an alloy of lithium fluoride (LiF), calcium (Ca), and aluminum (Al).

Configuration of Sealing Layer

The sealing layer 17 protects the organic EL element 37 from such impurities as water and oxygen. As illustrated in FIG. 5, this sealing layer 17 includes: a first inorganic film 48 provided to cover the light-emitting element layer 16; an organic film 49 provided on the first inorganic film 48; and a second inorganic film 50 provided to cover the organic film 49.

The first inorganic film 48 and the second inorganic film 50 are formed of such inorganic materials as silicon dioxide ($SiO_2$), aluminum oxide ($Al_2O_3$), silicon nitride ($SiN_x$) such as trisilicon tetranitride ($Si_3N_4$), and silicon carbide nitride (SiCN). The organic film 49 is formed of such organic materials as acrylic resin, epoxy resin, polyuria resin, parylene resin, polyimide resin, and polyamide resin.

The first inorganic film 48, the organic film 49, and the second inorganic film 50 are provided to the entire display region 5, and also to the frame region 6. The periphery ends of the first inorganic film 48 and the second inorganic film 50 are positioned closer to the outside of the frame region 6 than the periphery end of the organic film 49 is, and are joined together. The organic film 49 is wrapped in, and enclosed between, the first inorganic film 48 and the second inorganic film 50. The sealing layer 17 is not provided to the terminal unit 7 or the folding portion 8.

Configuration of Barrier Structure

When an organic material of the organic film 49 is applied during a manufacturing process of the organic EL display device 1, the barrier structure 9 keeps the organic material from spreading outside the frame region 6. As illustrated in FIGS. 8 to 10, the barrier structure 9 includes: a first barrier wall 51 provided toward the display region 5; and a second barrier wall 52 provided outside the first barrier wall 51. The first barrier wall 51 and the second barrier wall 52 are formed all around the outer periphery of the planarization film 23, and each shaped into a frame to conform to the shape of the outer periphery of the display region 5. The first barrier wall 51 and the second barrier wall 52, which are similar in shape, are spaced apart from each other and arranged widthwise of the frame region 6. In this first embodiment, a clearance d between the first barrier wall 51 and the second barrier wall 52 is to be the same among the frame corner 6a, the first frame side 6c, and the second frame side 6d (see FIG. 8).

Each of the first barrier wall 51 and the second barrier wall 52 includes: a first wall layer 53 provided on the active element layer 15; and a second wall layer 54 provided on the first wall layer 53. The first wall layer 53 is formed in the same layer, and of the same material, as the planarization film 23 is. The second wall layer 54 is formed in the same layer, and of the same material, as the edge cover 42 is. Of the two barrier walls 51 and 52, the first barrier wall 51 surrounds the organic film 49 and overlaps a periphery end of the organic film 49, thus limiting a region in which the organic film 49 is formed. The organic film 49 fills the interior of the first barrier wall 51, and covers all the display region 5 and a portion of the inside of the frame region 6.

Configurations of Low-Level Power Source Wire and Connecting Conductor

As illustrated in FIG. 3, the low-level power source wire 21*lp* includes: an inner wire G0 surrounding the display region 5; and an outer wire 61 surrounding the inner wire 60. The inner wire 60 and the outer wire 61 are separated from each other, and extend along a portion of the second frame side 6d below, the first frame side 6c on both of the right and left sides, both of the frame corners 6a above, the frame notch 6b, and the second frame side 6d. The inner wire 60 and the outer wire 61 are combined together in the second frame side 6d below, and lead out to the terminal unit 7 through the folding portion 8. The low-level power source wire 21*lp* is electrically connected to the low-level voltage power source (ELVSS) through the wiring terminal 21*t* provided to the terminal unit 7.

As illustrated in FIG. 9, the inner wire 60 and the outer wire 61 are included in a first conductive layer 63 provided in the frame region 6 and below the planarization film 23. The first conductive layer 63 includes: an inner conductor 63a relatively narrow and included in the inner wire 60; and an outer conductor 63b relatively wide and included in the outer wire 61. The inner conductor 63a and the outer conductor 63b are formed in the same layer, and of the same film, as the source wire 21s, the source electrode 28, and the drain electrode 29 are. The inner conductor 63a and the outer conductor 63b are provided on the interlayer insulating film 27. Note that the inner conductor 63a is provided to reduce electric resistance between the first conductive layer 63 and the second conductive layer 64, and thus may be omitted.

The inner conductor 63a is provided across the trench 36 and positioned to correspond entirely widthwise of the trench 36. This inner conductor 63a is exposed from the planarization film 23 at a bottom of the trench 36, and serves as a bottom face of the trench 36. Meanwhile, the outer conductor 63b is provided to coincide with the planarization film 23, and lies to the second barrier wall 52. This outer conductor 63b is exposed from the planarization film 23 between the planarization film 23 and the first barrier wall 51, and between the first barrier wall 51 and the second barrier wall 52.

In the frame region 6, provided on the planarization film 23 is the second conductive layer 64 electrically connecting the second electrode 40 of the organic EL element 37 to the first conductive layer 63. The connecting conductor 10 includes this second conductive layer 64. The second conductive layer 64 is formed in the same layer, and of the same material, as the first electrode 38 of the organic EL element 37 is. This second conductive layer 64 is provided on the planarization film 23, and lies to the second barrier wall 52. The second conductive layer 64 is positioned between the first wall layer 53 and the second wall layer 54 included in the first barrier wall 51, and between the first wall layer 53 and the second wall layer 54 included in the second barrier wall 52.

The second conductive layer 64 overlaps, and comes into contact with, the outer conductor 63b between the planarization film 23 and the first barrier wall 51, and between the first barrier wall 51 and the second barrier wall 52. Hence, the second conductive layer 64 is connected to the outer conductor 63b outside the planarization film 23. Moreover, on the planarization film 23, the second conductive layer 64 is provided from outside the planarization film 23 with respect to the trench 36 toward the display region 5 with respect to the trench 36. The second planarization film 23 covers an inner face of the trench 36, and connects to the inner conductor 63a exposed inside the trench 36.

The second electrode 40 is provided on the planarization film 23, and lies from the display region 5 with respect to the trench 36 toward the outside the planarization film 23 with respect to the trench 36. Together with the second conductive layer 64, the second electrode 40 covers the inner face of the trench 36. Because the inner face of the trench 36 is covered with the second conductive layer 64 and the second electrode 40, the display panel 4 keeps such an impurity as water from reaching the display region 5 from outside through the trench 36. Moreover, inside the trench 36, the second electrode 40 and the second conductive layer 64 overlap, come into contact, and connect with each other. Hence, inside the trench 36, the second electrode 40 electrically connects to the inner conductor 63a through the second conductive layer 64.

As can be seen, the second electrode 40 electrically connects to the outer conductor 63b outside the planarization film 23, and to the inner conductor 63a through the trench 36. Hence, the second electrode 40 electrically connects to the low-level power source wire 21lp through the connecting conductor 10 made of the second conductive layer 64. Such a feature ensures areas of contact between the second electrode 40 and the second conductive layer 64 and between the first conductive layer 63 and the second conductive layer 64. The ensured areas of contact reduce electric resistance between the second electrode 40 and the first conductive layer 63, contributing to assurance of display quality of the organic EL display device 1.

Configuration of Drive Circuit

As illustrated in FIG. 2; the drive circuit 11 is disposed behind the barrier structure 9 (the first barrier wall 51), and covered with the organic film 49. The drive circuit 11 includes: a gate driver 70 (also referred to as, for example, a scan line drive circuit) outputting a gate signal to the gate wires 21g; and an emission driver 75 (also referred to as, for example, a light-emission control circuit and a light-emission control line drive circuit) outputting an emission control signal to the emission control wires 21e. The gate driver 70 and emission driver 75 are implemented, using a shift register.

As illustrated in FIG. 8, the gate driver 70 includes a plurality of unit circuits 71 each provided to a corresponding one of the gate wires 21g and each representing one of the stages of the shift register. Moreover, the emission driver 75 includes a plurality of unit circuits 76 each provided to a corresponding one of the emission control wires 21e and each representing one of the stages of the shift register. The unit circuits 71 of the gate driver 70 and the unit circuits 76 of the emission driver 75 are formed of a combination of a plurality of TFTs 80 and a plurality of capacitors (not shown). The TFTs 80 are similar in configuration to the first to seventh TFTs 19a to 19g included in the pixel circuit 35 (see FIG. 9). Each of the capacitors is similar in configuration to the capacitor 20 included in the pixel circuit 35.

Each of the gate driver 70 and the emission driver 75 is disposed on either side of the trench 36 in the frame region. The gate driver 70 and the emission driver 75 are divided and provided to the first frame side 6c and the second frame side 6d.

Specifically, the gate driver 70 includes: a first gate driver 72 provided to the first frame side 6c; and a second gate driver 73 provided to the second frame side 6d. The first gate driver 72 and the second gate driver 73 are provided between the display region 5 and the trench 36. The unit circuits 71 (i.e. the stages of the shift register) included in the first gate driver 72 are each connected to a gate wire 21g included in the gate wires 21g and positioned to transversely correspond to the first frame side 6c; that is, a gate wire 21g extending in a direction intersecting with the first frame side 6c. Meanwhile, the unit circuits 71 (i.e. the stages of the shift register) included in the second gate driver 73 are each connected to an other gate wire 21g included in the gate wires 21g and positioned to transversely correspond to the frame corner 6a of the frame region 6; that is, an other gate wire 21g extending in a direction intersecting with the frame corner 6a, through a routed wire 80 routed inside the corner 6a.

In the first gate driver 72 and the second gate driver 73, connected to the unit circuits 71 are not-shown clock signal wires transmitting a clock signal and not-shown start pulse signal wires transmitting an activation start pulse signal. In accordance with the clock signal, each of the unit circuits 71 outputs a state signal indicating an internal state. The state signal output from each unit circuit 71 is output to the corresponding gate wire 21g, and then sent to a unit circuit 71 in the previous stage as a reset signal and to a unit circuit 71 in the successive stage as a set signal. Note that the unit circuit 71 in the first stage is provided with the activation start pulse signal as the set signal.

In the gate driver 70, when the activation start pulse signal is sent to the unit circuit 71 in the first stage, a shift pulse included in the state signal output from each of the unit circuits 71 is sequentially transferred in accordance with the clock signal from the first stage to the successive stages. Concurrently the state signal output from the unit circuit 71 of each stage is output to the corresponding gate wire 21g. The gate driver 70 carries out such operation to sequentially select and activate the gate wires 21g one by one in accordance with the transfer of the shift pulse.

The emission driver 75 includes: a first emission driver 77 provided to the first frame side 6c; and a second emission driver 78 provided to the second frame side 6d. The first emission driver 77 and the second emission driver 78 are provided between the trench 36 and the first barrier wall 51. The unit circuits 76 (i.e. the stages of the shift register) included in the first emission driver 77 are each connected to an emission control wire 21e included in the emission control wires 21e and positioned to transversely correspond to the first frame side 6c; that is, an emission control wire 21e extending in a direction intersecting with the first frame side 6c. Meanwhile, the unit circuits 76 (i.e. the stages of the shift register) included in the second emission driver 78 are each connected to an other emission control wire 21e included in the emission control wires 21e and positioned to transversely correspond to the frame corner 6a of the frame region 6; that is, an other emission control wire 21e extending in a direction intersecting with the frame corner 6a, through a routed wire 81 routed inside the corner 6a.

In the first emission driver 77 and the second emission driver 78, connected to the unit circuits 76 are not-shown clock signal wires transmitting a clock signal and not-shown start pulse signal wires transmitting a deactivation start pulse signal. The deactivation start pulse signal synchronizes with the shift pulse of the gate driver 70. In accordance with the clock signal, each of the unit circuits 76 outputs a state signal indicating an internal state. The state signal output from each unit circuit 76 is output to the corresponding emission control wire 21e, and then sent to a unit circuit 76 in the previous stage as a reset signal and to a unit circuit 76 in the successive stage as a set signal. Note that the unit circuit 76 in the first stage is provided with the deactivation start pulse signal as the set signal.

In the emission driver 75, when the deactivation start pulse signal is sent to the unit circuit 76 in the first stage, a shift pulse included in the state signal output from each of the unit circuits 76 is sequentially transferred in accordance with the clock signal from the first stage to the successive stages. Concurrently, the state signal output from the unit circuit 76 of each stage is output to the corresponding emission control wire 21e. The emission driver 75 carries out such operation to sequentially select and deactivate the emission control wires 21e one by one in accordance with the transfer of the shift pulse.

Configuration of Frame Corner of Frame Region

As illustrated in FIG. 8, neither the gate driver 70 nor the emission driver 75 is provided to the frame corner 6a. Alternatively, the gate driver 70 and the emission driver are provided at least one of the first frame side 6c and the second frame side 6d alone. A length a1 between the display region 5 and the first barrier wall 51 in the frame corner 6a is shorter than a length b1 between the display region 5 and the first barrier wall 51 in the first frame side 6c and a length c1 between the display region 5 and the first barrier wall 51 in the second frame side 6d. Meanwhile, a length a2 between an outer end edge and the second barrier wall 52 in the frame corner 6a is longer than a length b2 between an outer end edge and the second barrier wall 52 in the first frame side 6c and a length c2 between an outer end edge and the second barrier wall 52 in the second frame side 6d. A length A between an outer end edge and the display region 5 in the frame corner 6a is longer than or equal to a length B between an outer end edge and the display region 5 in the first frame side 6c, and a length C between an outer end edge and the display region 5 in the second frame side 6d.

The frame corner 6a has a crack reduction structure. As illustrated in FIG. 10, the crack reduction structure includes a slit 91 formed in a plurality of inorganic insulating films included in the active element layer 15; namely, the base coat film 18, the gate insulating film 25, and the interlayer insulating film 27. The slit 91 opens between the outer end edge and the second barrier wall 52 in the frame corner 6a, and is formed to expose the substrate resin layer 14 from the base coat film 18, the gate insulating film 25, and the interlayer insulating film 27. This slit 91 is filled with a filler layer 92 sealing an exposed cross-section of the active element layer 15. The filler layer 92 is formed, for example, in the same layer, and of the same material, as the planarization film 23 is. Such a crack reduction structure reduces the risk of a crack opening on the round corner 4a of the display panel 4.

In the above organic EL display device 1, when the corresponding emission control wire 21e is selected to be deactivated in each of the sub-pixels 13, the organic EL element 37 does not emit light. In such a case, the preceding gate wire 21g (n−1) is selected, and a gate signal is input through the preceding gate wire 21g (n−1) to the first TFT 19a. Hence, the first TFT 19a and the fourth TFT 19d turn ON, and a voltage of the corresponding initialization voltage wire 21v is applied to the capacitor 20. Thus, the charge stored in the capacitor 20 is discharged, and the voltage applied to the gate electrode 26 of the fourth TFT 19d is initialized. Next, when the corresponding gate wire 21g (n) is selected and activated, the second TFT 19b and the third TFT 19c turn ON. Hence, a predetermined voltage, which corresponds to a source signal to be transmitted through the corresponding source wire 21s, is written in the capacitor 20 through the fourth TFT 19d in a connected state, and the seventh TFT 19g turns ON. Thus, an initialization signal is applied through the corresponding initialization voltage wire 21v to the first electrode 38 of the organic EL element 37, and charge stored in the first electrode 38 is reset. After that, the corresponding emission control wire 21e is selected, and the fifth TFT 19e and the sixth TFT 19f turn ON. Hence, a drive current in accordance with a voltage applied to the gate electrode 26 of the fourth TFT 19d is supplied from the corresponding high-level power source wire 21hp to the organic EL element 37. Thus, the organic EL element 37 emits light having brightness in accordance with the drive current, presenting an image.

In the organic EL display device 1 according to this first embodiment, the gate driver 70 and the emission driver 75 are divided and provided to the first frame side 6c and the second frame side 6d. The first frame side 6c and the second frame side 6d are provided in the frame region 6 to sandwich therebetween the frame corner 6a included in the round corner 4a of the display panel 4. Such a feature makes it possible to eliminate, or reduce, the unit circuits 71 of the gate driver 70 and the unit circuits 76 of the emission driver 75 that should be arranged in the frame corner 6a. The elimination or reduction of the unit circuits 71 and 76 makes it possible to reduce the length a1 between the display region 5 and the first barrier wall 51 in the frame corner 6a, and to increase, for the deduced length a1, the length a2 between the outer end edge and the second barrier wall 52 in the frame corner 6a. Consequently, in the round corner 4a of the display panel 4 having an other shape than a rectangle, the feature makes it possible to downsize the frame region 6 while keeping a crack from opening in the display region 5.

Modification of First Embodiment

Figure 11:
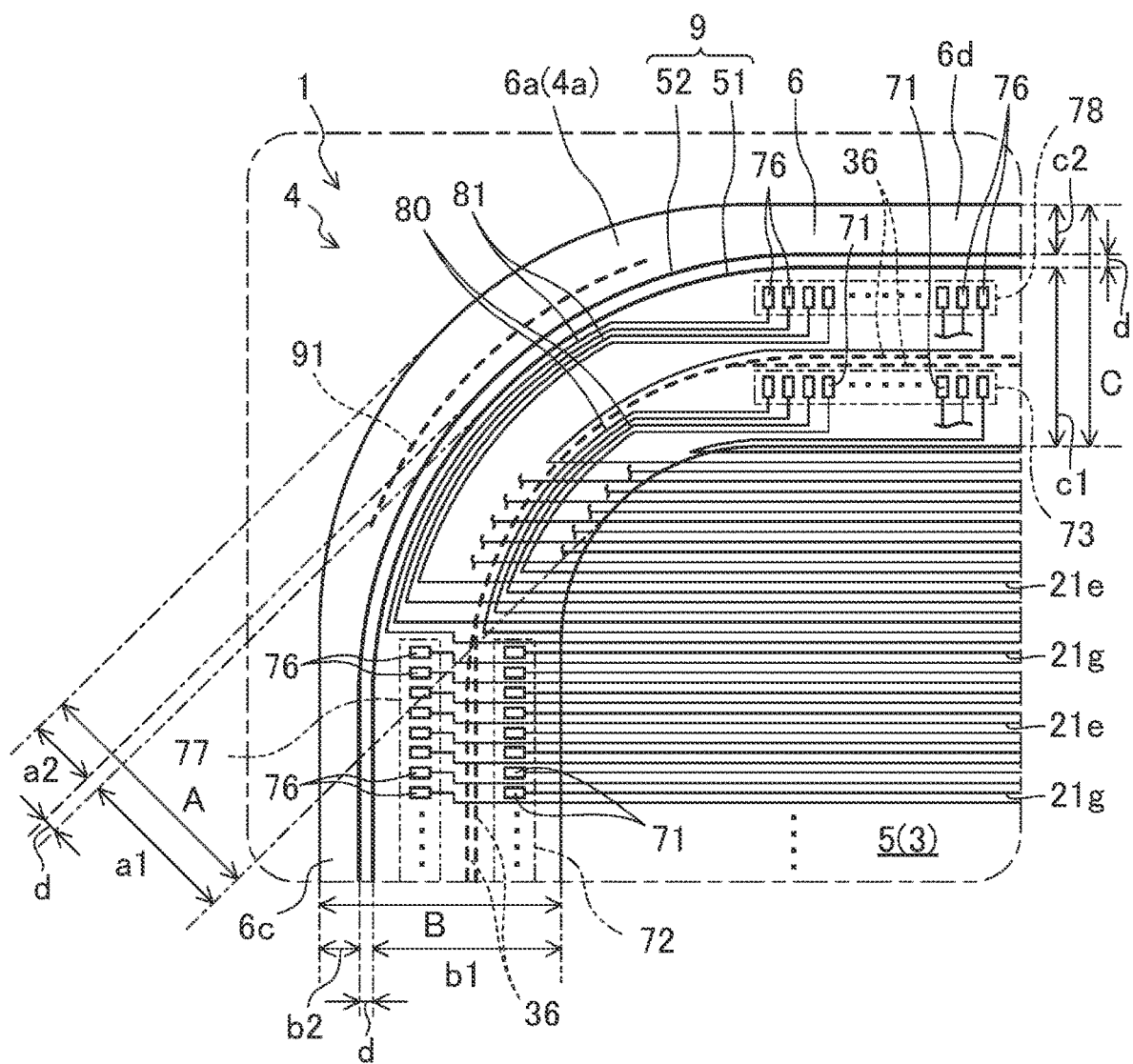
FIG. 11 is a plan view corresponding to FIG. 8 and illustrating the organic EL display device according to a modification of the first embodiment.

FIG. 11 is a plan view corresponding to FIG. 8 and illustrating the organic EL display device 1 according to a modification. In the organic EL display device 1 according to the first embodiment, one trench 36 is formed in the planarization film 23. In the organic EL display device 1 according to this modification illustrated in FIG. 11, the trench 36 includes two trenches 36 extending side by side in the frame notch 6b, the first frame side 6c, and the second frame side 6d. The two trenches 36 join together in each frame corner 6a.

In the frame notch 6b, the first frame side 6c, and the second frame side 6d, the inner conductor 63a included in the first conductive layer 63 is provided to lie between (i) a position closer to the display region 5 with respect to one of the trenches 36 toward the display region 5 and (ii) a position closer to an outer periphery of the frame region 6 with respect to the other one of the trenches 36 toward the outer periphery of the frame region 6. The inner conductor 63a is positioned to correspond to both of the two trenches 36 extending side by side. The second conductive layer 64 covers inner faces of the both trenches 36, and connects to the inner conductor 63a exposed inside each of the trenches 36. On the planarization film 23 and inside both of the trenches 36, the second electrode 40 overlaps, and comes into contact with, the second conductive layer 64, and electrically connects through the second conductive layer 64 to the inner conductor 63a. Concurrently, the second electrode 40 electrically connects also to the outer conductor 63b on the outer periphery of the planarization film 23.

In the organic EL display device 1 according to this modification, the two trenches 36 are formed to extend side by side in the frame notch 6b, the first frame side 6c, and the second frame side 6d. The second electrode 40 and the first conductive layer 63b electrically connect to each other inside both of the trenches 36 through the second conductive layer 64. Such features make it possible to further enlarge areas of contact between the second electrode 40 and the second conductive layer 64 and between the first conductive layer 63 and the second conductive layer 64. The enlarged areas of contact beneficially reduce electric resistance between the second electrode 40 and the first conductive layer 63, contributing to assurance of display quality of the organic EL display device 1. Furthermore, the trenches 36 join together in each of the frame corners 6a, not keeping the frame corners 6a from downsizing.

Second Embodiment

Figure 12:
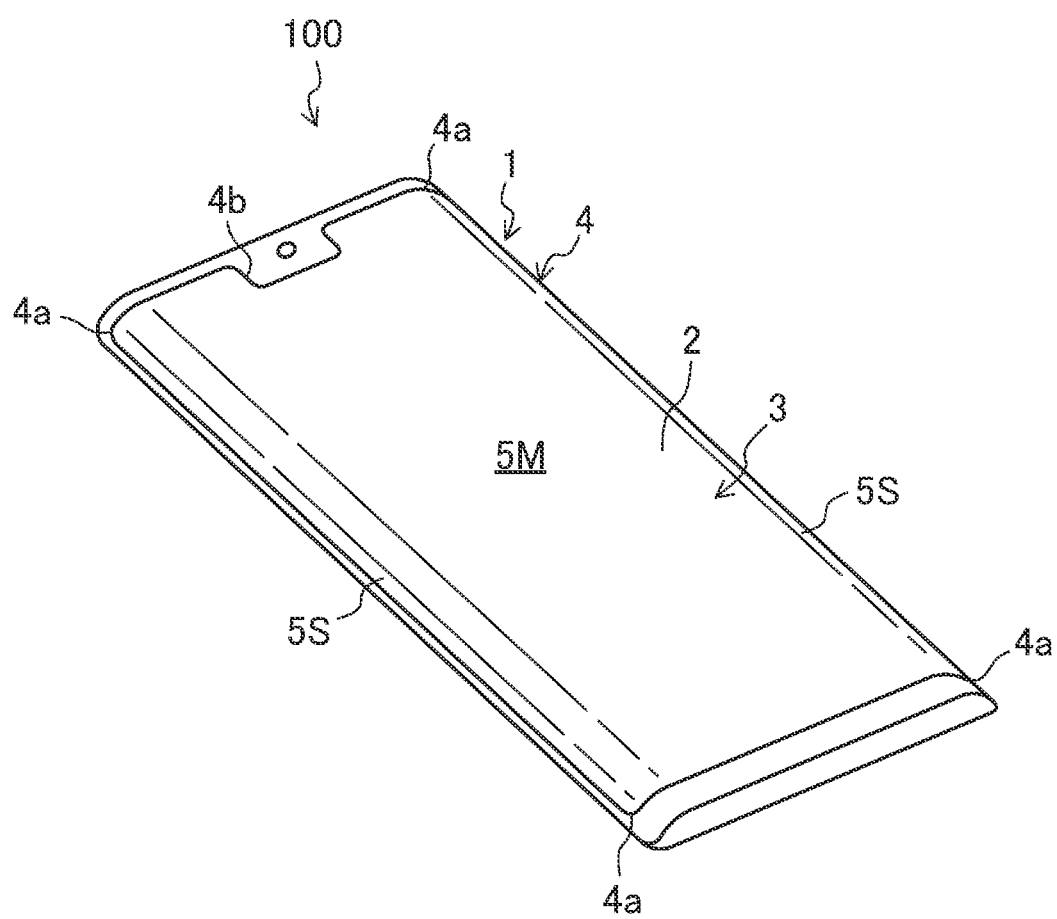
FIG. 12 is a perspective view of the information terminal including the organic EL display device according to a second embodiment.
Figure 13:
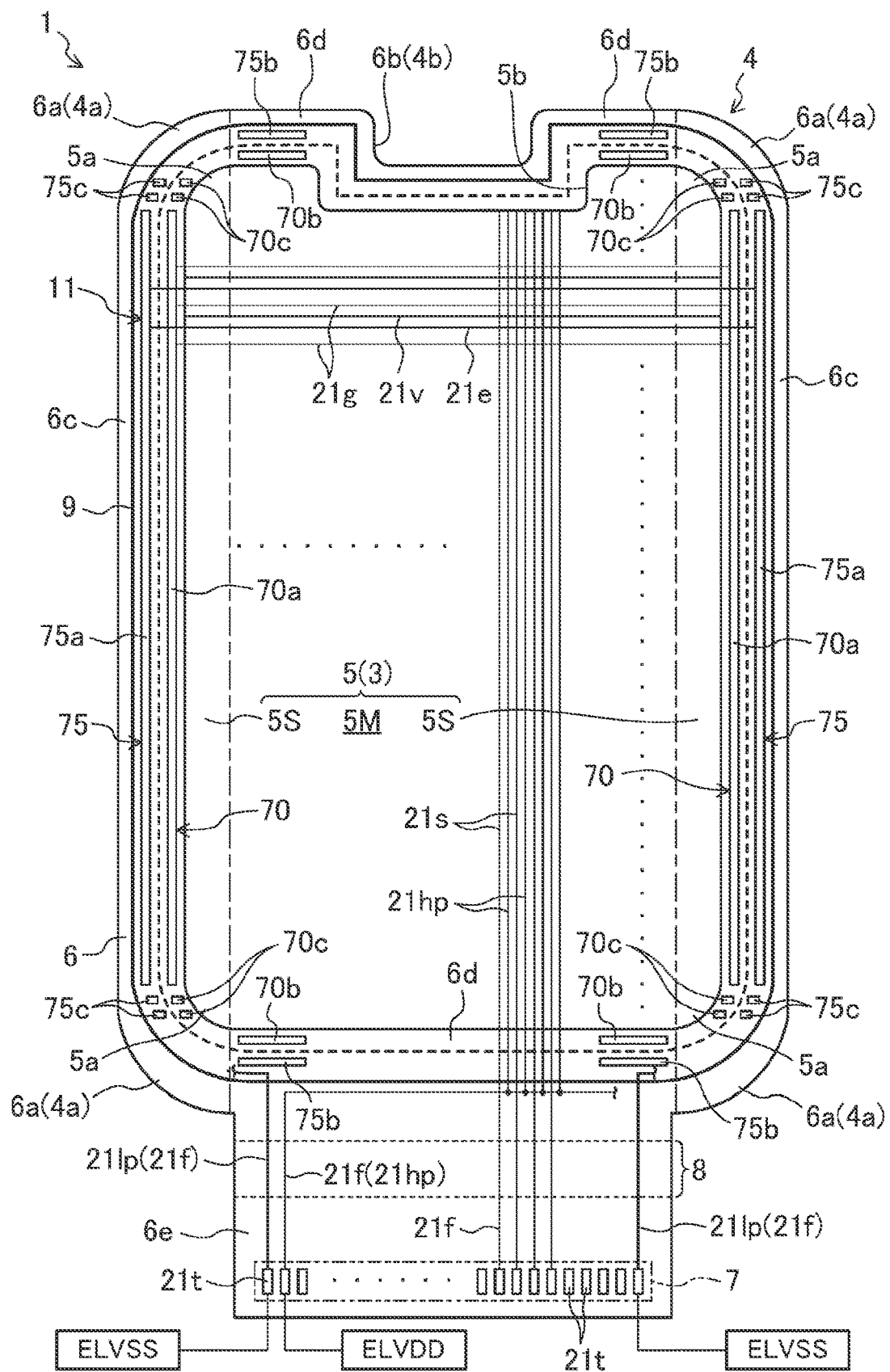
FIG. 13 is a plan view illustrating a schematic configuration of the display panel included in the organic EL display device according to the second embodiment.

FIG. 12 is a perspective view of the information terminal 100 including the organic EL display device 1 according to a second embodiment, FIG. 13 is a plan view illustrating a schematic configuration of the display panel 4 included in the organic EL display device 1 according to the second embodiment. In the organic EL display device 1 according to the first embodiment, a display surface 3 including the screen 2 is formed flat overall; whereas, the organic EL display device 1 according to this second embodiment is a flexible display that bends and changes in shape. As illustrated in FIG. 12, the display surface 3 including the screen 2 is mounted on the information terminal 100 with both right and left ends of the display surface 3 bent so that the display surface 3 is provided not only on the front but also to right and left sides of the information terminal 100.

The display region 5 of the organic EL display device 1 includes: a main display region 5M provided to a front face of the display panel 4; and side display regions 5S each provided sideways to the display panel 4 on either the right or left of the main display region 5M. In FIG. 13, dash-dot-dash lines longitudinally extending on the right and the left of the display panel 4 indicate borders between the main display region 5M and the side display regions 5S. Hence, if the display region 5 includes the side display regions 5S so that the display surface 3 is provided sideways to the right and the left, the frame region 6 is enlarged widthwise compared with the case where the display surface 3 is formed flat overall. As illustrated in FIG. 13, this organic EL display device 1 takes advantage of the enlarged space of the frame region 6, so that the frame corner 6a toward the first frame side 6c in the frame region 6 is also provided with a third gate driver 74 included in the gate driver 70 and a third emission driver 79 included in the emission driver 75.

In the organic EL display device 1 according to this second embodiment, the frame corner 6a can be downsized, and still be provided with unit circuits 71 of the third gate driver 74 and unit circuits 76 of the third emission driver 79 in larger number.

As can be seen, described above are preferable embodiments and a modification of one of the embodiments as examples of a technique of the present disclosure. However, the technique of the present disclosure shall not be limited to techniques in the embodiments and the modification. The technique is applicable to an other embodiment subjected to such changes as modification, replacement, addition, and omission as appropriate. Moreover, the constituent features described in the embodiments and the modification can be combined to form a new embodiment. Furthermore, some of the constituent features in the drawings and the embodiments might not be essential to overcome a technical problem. Hence, such unessential constituent features shall not be interpreted essential simply because these unessential constituent features are recited in the drawings and the embodiments.

In the first embodiment, both the gate driver 70 and the emission driver 75 are divided and provided to the first frame side 6c and the second frame side 6d. However, the technique of the present disclosure shall not be limited to such an arrangement. For example, either the gate driver 70 or the emission driver 75 alone may be divided and provided to the first frame side 6c and the second frame side 6d.

Moreover, in the first embodiment, the length A between the outer end edge and the display region 5 in the frame corner 6a of the frame region 6 is longer than or equal to the length B between the outer end edge and the display region 5 in the first frame side 6c, and the length C between the outer end edge and the display region 5 in the second frame side 6d. However, the technique of the present disclosure shall not be limited to such lengths A, B, and C. The length A between the outer end edge and the display region 5 in the frame corner 6a of the frame region 6 may be shorter than the length B between the outer end edge and the display region 5 in the first frame side 6c, and than the length C between the outer end edge and the display region 5 in the second frame side 6d.

Furthermore, in the first embodiment, the organic EL layer 39 is individually provided to each of the sub-pixels 13. However, an applicable scope of the technique of the present disclosure shall not be limited to such an arrangement. The organic EL layer 39 may be provided in common among the sub-pixels 13. In such a case, the organic EL display device 1 may include, for example, a color filter to represent a color tone of each of the sub-pixels 13.

In addition, in the first embodiment, the sub-pixels 13r, 13g, and 13b included in each pixel 12 and representing three colors are arranged, for example, in a pattern of stripes. However, the technique of the present disclosure shall not be limited to such an arrangement. The colors of the sub-pixels 13 included in each pixel 12 shall not be limited to three colors. The colors may be four or more colors. The sub-pixels 13 included in each pixel 12 may be arranged in an other manner such as a pentile arrangement.

Moreover, in the first embodiment, the organic EL display device 1 uses, for example, the substrate resin layer 14 as a substrate. However, in the technique of the present disclosure, the substrate shall not be limited to a resin layer. The substrate may be made of such inorganic materials as glass and quartz, such a plastic as polyethylene terephthalate, and such a ceramic as alumina. Moreover, the substrate may be a metal substrate made of aluminum or iron. One face of the metal substrate may be coated with, for example, silica gel or an organic insulating material. Alternatively, the surface of the metal substrate may be anodized to be insulated.

Furthermore, in the first embodiment, the first to seventh TFTs 19a to 19g are of the top gate structure. However, an applicable scope of the technique of the present disclosure shall not be limited to the top gate structure. The first to seventh TFTs 19a to 19g may be of the bottom gate structure.

In addition, in the first embodiment, the organic EL display device 1 includes, for example, the first electrode 38 as an anode and the second electrode 40 as a cathode. However, an applicable scope of the technique of the present disclosure shall not be limited to such a structure. In the technique of the present disclosure, for example, the multilayer structure of the organic EL layer 39 may be inverted so that the organic EL display device 1 can include the first electrode 38 as a cathode and the second electrode 40 as an anode.

Moreover, in the first embodiment, the organic EL layer 39 is of, for example, a multilayer structure including such five layers as the hole-injection layer 43, the hole-transport layer 44, the light-emitting layer 45, the electron-transport layer 46, and the electron-injection layer 47. However, an applicable scope of the technique of the present disclosure shall not be limited to such a structure. The organic EL layer 39 may adopt any given structure including, for example, such three layers as a layer serving as both a hole-injection layer and a hole-transport layer, a light-emitting layer, and a layer serving as both an electron-transport layer and an electron-injection layer.

Furthermore, in the first and second embodiments, the organic EL display device 1 is described as an example of a display device. However, an applicable scope of the technique of the present disclosure shall not be limited to an organic EL display device. The technique of the present disclosure may be applicable to display devices including a plurality of light-emitting elements driven by current such as, for example, a display device including quantum-dot light emitting diodes (QLEDs); that is, light-emitting elements including a layer containing quantum dots.

INDUSTRIAL APPLICABILITY

As can be seen, a technique of the present disclosure may be useful for a display device including a display panel shaped to include a round corner.

The invention claimed is:

1. A display device, comprising:
a base substrate;
an active element layer including a plurality of active elements, a plurality of display wires, and a drive circuit all of which are provided above the base substrate;
a light-emitting element layer including a plurality of light-emitting elements provided on the active element layer; and
a sealing layer including an organic film provided to cover the light-emitting element layer,
the base substrate, the active element layer, the light-emitting element layer, and the sealing layer constituting a display panel including: a display region displaying an image; a frame region provided to surround the display region; and at least one round corner having a curved outline in plan view,
the display region being provided with the display wires including: a plurality of gate wires extending in parallel with one an other in a first direction; a plurality of emission control wires extending in parallel with the gate wires; and a plurality of source wires extending in a second direction intersecting with the gate wires and the emission control wires, and the light-emitting elements being each included in a pixel circuit provided for each of intersections of the gate wires and the source wires,
the frame region being provided with: the drive circuit including a gate driver configured to output a gate signal to the gate wires, and an emission driver configured to output an emission control signal to the emission control wires; and a barrier wall surrounding the organic film,
the frame region including: a frame corner including the at least one round corner of the display panel; and two sides provided so that the frame corner is sandwiched between the two sides, the two sides including a first frame side in parallel with the gate wires, and a second frame side in parallel with the source wires,
at least one of the gate driver and the emission driver being divided and provided to the first frame side and the second frame side, and
a length between the display region and the barrier wall in at least a portion of the frame corner being shorter than a length between the display region and the barrier layer in the first frame side.

2. The display device according to claim 1, wherein
a length between an outer end edge and the barrier wall in the frame corner is longer than a length between an outer end edge and the barrier wall in the second frame side.

3. The display device according to claim 1, wherein
the gate driver includes: a first gate driver provided to the first frame side; and a second gate driver provided to the second frame side.

4. The display device according to claim 3, wherein the first gate driver is connected to a gate wire included in the gate wires and extending in a direction intersecting with the first frame side in the second direction, and the second gate driver is connected to another gate wire included in the gate wires and extending in a direction intersecting with the frame corner in the second direction.

5. The display device according to claim 1, wherein
the emission driver includes: a first emission driver provided to the first frame side; and a second emission driver provided to the second frame side.

6. The display device according to claim 5, wherein
the first emission driver is connected to an emission control wire included in the emission control wires and extending in a direction intersecting with the first frame side in the second direction, and
the second emission driver is connected to an other emission control wire included in the emission control wires and extending in a direction intersecting with the frame corner in the second direction.

7. The display device according to claim 1, wherein
the active element layer includes: a first conductive layer provided to the frame region; and a planarization film provided behind the barrier wall to cover the first conductive layer, the active elements, the display wires, and the drive circuit,
the planarization film includes a trench formed through the planarization film and surrounding the display region,
the light-emitting element includes: a first electrode provided on the planarization film; a light-emitting functional layer provided on the first electrode; and a second electrode provided to overlap the first electrode,
the frame region is provided with a second conductive layer in contact with the second electrode on the planarization film, and in contact with the first conductive layer on an outer periphery of the planarization film,
the first conductive layer is positioned to correspond to the trench, and exposed from the planarization film inside the trench,
each of the second conductive layer and the second electrode is provided inside the trench, and
the first conductive layer and the second conductive layer are in contact with each other inside the trench, and the second conductive layer and the second electrode are in contact with each other inside the trench.

8. The display device according to claim 7, wherein
the gate driver includes: a first gate driver provided to the first frame side; and a second gate driver provided to the second frame side, and
the second gate driver is provided between the display region and the trench.

9. The display device according to claim 7, wherein
the gate driver includes: a first gate driver provided to the first frame side; and a second gate driver provided to the second frame side, and
the first gate driver is provided between the display region and the trench.

10. The display device according to claim 7, wherein
the emission driver includes: a first emission driver provided to the first frame side; and a second emission driver provided to the second frame side, and
the second emission driver is provided between the trench and the barrier wall.

11. The display device according to claim 7, wherein
the emission driver includes: a first emission driver provided to the first frame side; and a second emission driver provided to the second frame side, and
the first emission driver is provided between the trench and the barrier wall.

12. The display device according to claim 7, wherein
the active element layer includes as the active element a thin-film transistor (TFT) including a source electrode provided on the planarization film, and
the second conductive layer is formed in the same layer, and of the same material, as the source electrode is.

13. The display device according to claim 7, wherein
the trench includes a plurality of trenches extending side by side.

14. The display device according to claim 13, wherein
the trenches join together in the frame corner.

15. The display device according to claim 1, wherein
the active element layer includes a plurality of inorganic films provided on the base substrate in the display region and the frame region, and
at least one of the inorganic insulating films includes a slit formed to open between the outer end edge and the barrier wall of the frame region in the frame corner.

16. The display device according to claim 15, wherein
the slit is formed to expose the base substrate from the inorganic insulating films, and
the slit is filled with a filler layer sealing an exposed cross-section of the active element layer.

17. The display device according to claim 1, wherein
the base substrate is made of flexible resin, and
the display device is a flexible display that bends and changes in shape.

18. The display device according to claim 17, wherein
the display region includes: a main display region provided to a front face of the display panel; and a side display region provided sideways to the display panel.

* * * * *